US008324680B2

(12) United States Patent
Izumi et al.

(10) Patent No.: US 8,324,680 B2
(45) Date of Patent: Dec. 4, 2012

(54) NON-VOLATILE SEMICONDUCTOR STORAGE DEVICE WITH LAMINATED VERTICAL MEMORY CELL AND SELECT TRANSISTORS

(75) Inventors: Tatsuo Izumi, Yokohama (JP); Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/034,309

(22) Filed: Feb. 24, 2011

(65) Prior Publication Data

US 2011/0141821 A1 Jun. 16, 2011

Related U.S. Application Data

(60) Continuation of application No. 12/858,478, filed on Aug. 18, 2010, now Pat. No. 7,902,023, which is a division of application No. 12/245,199, filed on Oct. 3, 2008, now Pat. No. 7,800,163.

(30) Foreign Application Priority Data

Oct. 5, 2007  (JP) ................. 2007-262430

(51) Int. Cl.
*H01L 29/792* (2006.01)
*G11C 16/08* (2006.01)
(52) U.S. Cl. ............ 257/324; 257/E29.309; 365/185.23
(58) Field of Classification Search .......... 365/185.17–185.18, 185.21, 185.23, 365/185.27–185.28; 257/315, 324, 326, 257/331, E29.309, E21.41, E21.679, E27.081
See application file for complete search history.

(56) References Cited

U.S. PATENT DOCUMENTS

| 6,933,556 | B2 | 8/2005 | Endoh et al. |
| 2005/0063237 | A1 | 3/2005 | Masuoka et al. |
| 2006/0091556 | A1 | 5/2006 | Shigeoka |
| 2008/0242025 | A1 | 10/2008 | Kim et al. |
| 2008/0258203 | A1 | 10/2008 | Happ et al. |

FOREIGN PATENT DOCUMENTS

| JP | 10093083 | 4/1998 |
| JP | 2002-368140 | 12/2002 |
| JP | 2003-68886 | 3/2003 |

OTHER PUBLICATIONS

Japanese Office Action dated Aug. 7, 2012, in Japanese Patent Application No. 2007-262430 filed Oct. 5, 2007 (with English Translation).

*Primary Examiner* — Victor A Mandala
*Assistant Examiner* — Selim Ahmed
(74) *Attorney, Agent, or Firm* — Oblon, Spivak, McClelland, Maier & Neustadt, L.L.P.

(57) ABSTRACT

A non-volatile semiconductor storage device includes: a substrate; a control circuit layer provided on the substrate; a support layer provided on the control circuit layer; and a memory cell array layer provided on the support layer. The memory cell array layer includes: a first lamination part having first insulation layers and first conductive layers alternately laminated therein; and a second lamination part provided on either the top or bottom surface of the respective first lamination part and laminated so as to form a second conductive layer between second insulation layers. The control circuit layer includes at least any one of: a row decoder driving word lines provided in the memory cell array layer, and a sense amplifier sensing and amplifying a signal from bit lines provided in the memory cell array layer.

11 Claims, 27 Drawing Sheets

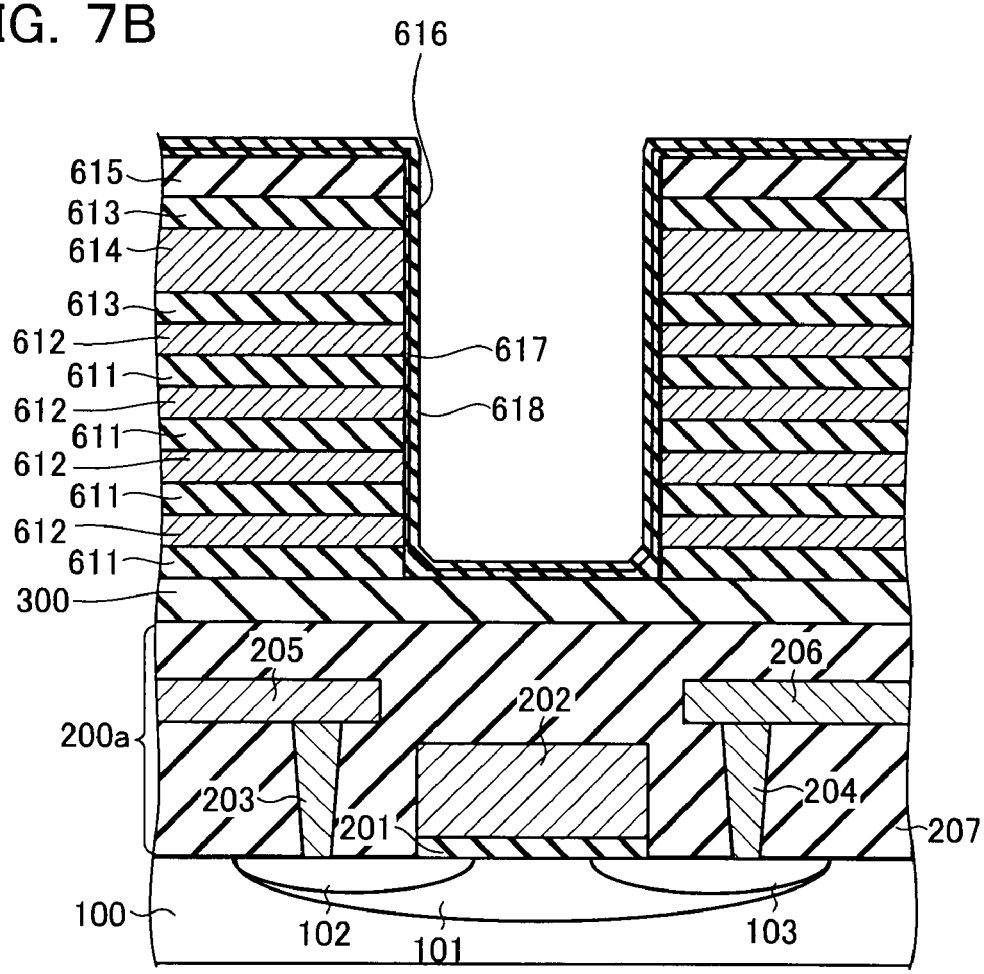

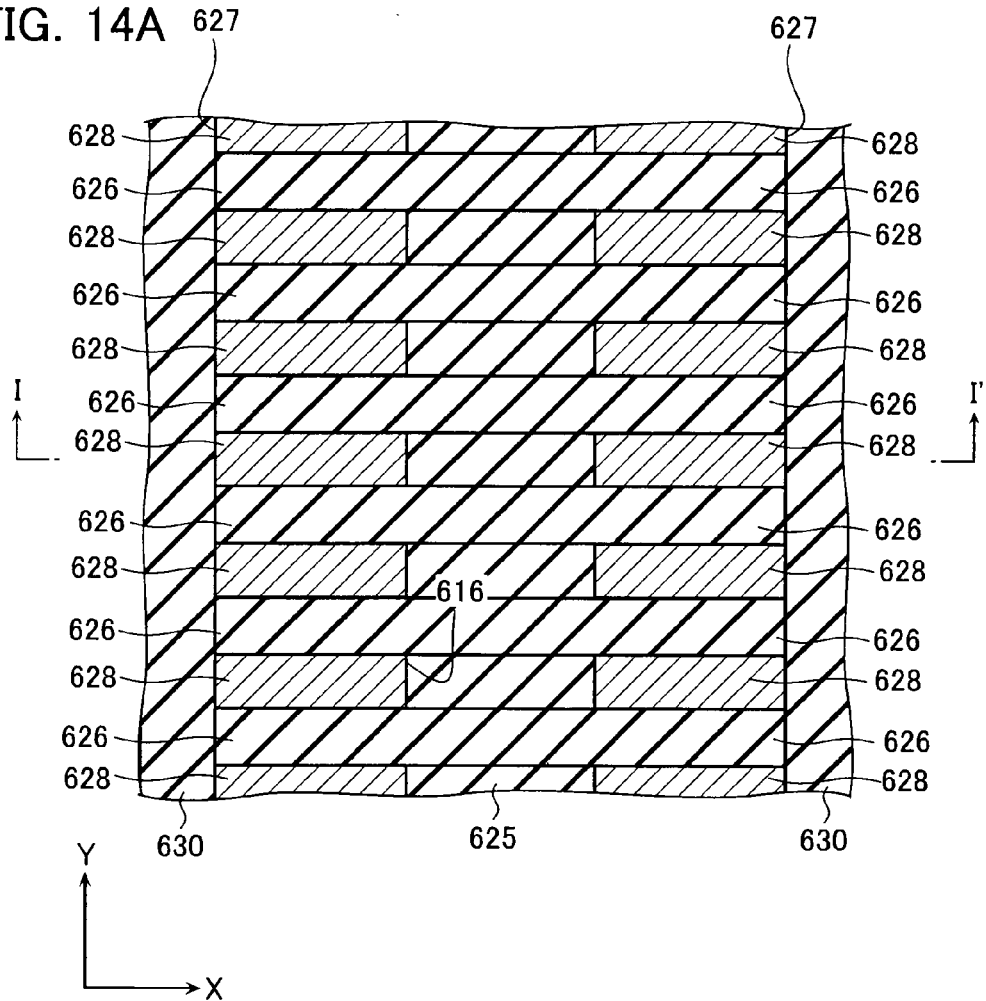

NON-VOLATILE SEMICONDUCTOR STORAGE DEVICE WITH LAMINATED VERTICAL MEMORY CELL AND SELECT TRANSISTORS

CROSS-REFERENCE TO RELATED APPLICATIONS

This application is a continuation of U.S. application Ser. No. 12/858,478 filed Aug. 18, 2010, and is based upon and claims the benefit of priority from the prior Japanese Patent Application No. 2007-262430, filed on Oct. 5, 2007, the entire contents of each of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Recently, the number of bits (the number of transistors) tends to increase for the purpose of providing a larger amount of data to be written to one chip. This is achieved by shrinking the transistor size. On the other hand, for EEPROM using high voltage in writing or the like, HV-type transistors are essential that are durable for such high voltage. For example, non-volatile semiconductor devices includes two regions: a memory cell array arranging region, and a periphery region that surrounds the memory cell array arranging region, as disclosed in Patent Document 1 (Japanese Patent Laid-Open No. 2002-368141). The HV-type transistors are arranged in the periphery regions.

However, such HV-type transistors cannot be shrunken since it is difficult to decrease writing voltage. Furthermore, for example, the HV-type transistors are required as many as word lines because they are provided in row decoder circuits connected to the word lines, and hence the number of HV-type transistors cannot be reduced. Therefore, these HV-type transistors form bottlenecks for the entire chip, causing problems that the chip size cannot be shrunken.

SUMMARY OF THE INVENTION

One aspect of the present invention provides a non-volatile semiconductor storage device comprising: a substrate; a control circuit layer provided on the substrate; a support layer provided on the control circuit layer; and a memory cell array layer provided on the support layer, the memory cell array layer comprising: a first lamination part having first insulation layers and first conductive layers alternately laminated therein; and a second lamination part provided on either the top or bottom surface of the respective first lamination part and laminated so as to form a second conductive layer between second insulation layers, the first lamination part comprising: a third insulation layer provided in contact with the respective sidewalls of the first insulation layers and the first conductive layers; a charge accumulation layer provided in contact with the third insulation layer and accumulating charges; a fourth insulation layer provided in contact with the charge accumulation layer; and a first semiconductor layer provided in contact with the fourth insulation layer and formed to extend to the lamination direction, the second lamination part comprising: a fifth insulation layer provided in contact with the respective sidewalls of the second insulation layers and the second conductive layer; and a second semiconductor layer provided in contact with the fifth insulation layer and the first semiconductor layer and formed to extend to the lamination direction, the control circuit layer comprising at least any one of: a row decoder driving word lines provided in the memory cell array layer, and a sense amplifier sensing and amplifying a signal from bit lines provided in the memory cell array layer.

Another aspect of the present invention provides a method of manufacturing a non-volatile semiconductor storage device, the method comprising: forming a control circuit layer, the control circuit layer comprising at least anyone of a row decoder driving word lines provided in a memory cell array, and a sense amplifier sensing and amplifying a signal from bit lines provided in the memory cell array; forming a support layer on the control circuit layer; and forming a memory cell array layer including the memory cell array on the support layer, the memory cell array layer being formed by: laminating a plurality of first conductive layers on the support layer in the lamination direction via first insulation layers; forming second conductive layers on the first conductive layers via second insulation layers; forming first trenches extending to a first direction perpendicular to the lamination direction penetrating the first insulation layers, the first conductive layers, the second insulation layers, and the second conductive layer; sequentially forming a third insulation layer, a charge accumulation layer, and a fourth insulation layer on the sidewalls of the first conductive layers facing the first trenches; forming a fifth insulation layer on the sidewall of the second conductive layer facing the first trenches; forming a semiconductor layer in contact with the fourth insulation layer and the fifth insulation layer facing the first trenches; and after forming the semiconductor layer, forming second trenches extending to a second direction perpendicular to the lamination direction and the first direction, spaced apart by a predetermined pitch in the first direction, penetrating up to the support layer.

BRIEF DESCRIPTION OF THE DRAWINGS

FIG. 7B is a cross-sectional view, taken along line I-I' of FIG. 7A, illustrating a manufacturing process of the non-volatile semiconductor storage device according to the first embodiment of the present invention;

FIG. 14A is a top plan view illustrating a manufacturing process of the non-volatile semiconductor storage device according to the first embodiment of the present invention;

DETAILED DESCRIPTION OF THE EMBODIMENTS

Embodiments of a non-volatile semiconductor storage device according to the present invention will now be described below with reference to the accompanying drawings.

[First Embodiment]

(General Configuration of Non-Volatile Semiconductor Storage Device According to First Embodiment)

Figure 1:
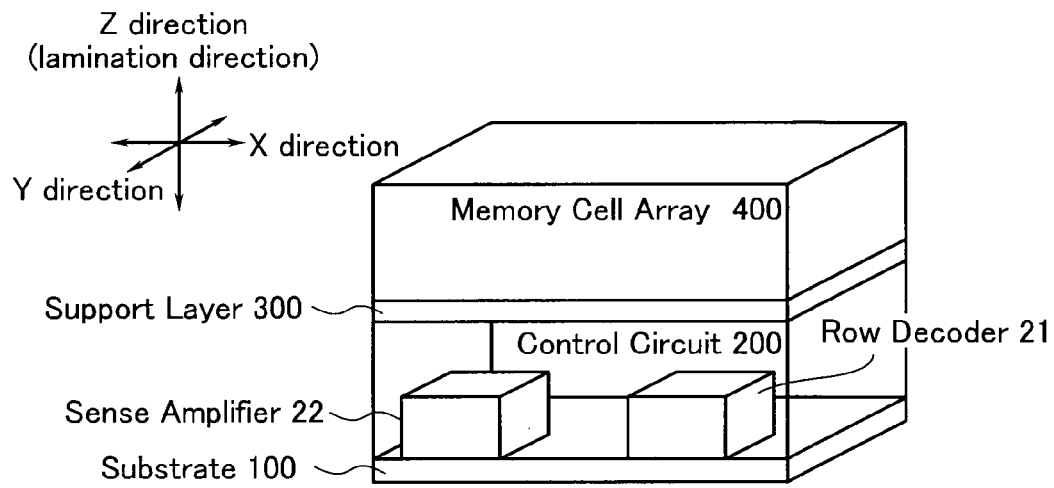
FIG. 1 is a diagram illustrating a general configuration of a non-volatile semiconductor storage device according to a first embodiment of the present invention.

FIG. 1 is a schematic diagram of a non-volatile semiconductor storage device according to a first embodiment of the present invention. As illustrated in FIG. 1, the non-volatile semiconductor storage device according to the first embodiment has a substrate 100; a control circuit 200 provided on the substrate 100; a support layer 300 provided on the control circuit 200; and a memory cell array 400 provided on the support layer 300.

The control circuit 200 has a function for controlling the operation of the memory cell array 400. The control circuit 200 includes a row decoder 21, a sense amplifier 22, etc. The row decoder 21 drives the potentials of word lines WL to "H (high level)" or "L (low level)" that are provided in the memory cell array 400 (see FIG. 2, discussed below). The sense amplifier 22 senses and amplifies signals from bit lines BL in the memory cell array 400 (see FIG. 2, discussed below). Note that the control circuit 200 may have a column decoder, etc., in addition to the row decoder 21 and the sense amplifier 22.

(Circuit Configuration of Memory Cell Array 400 in Non-Volatile Semiconductor Storage Device According to First Embodiment)

Figure 2:
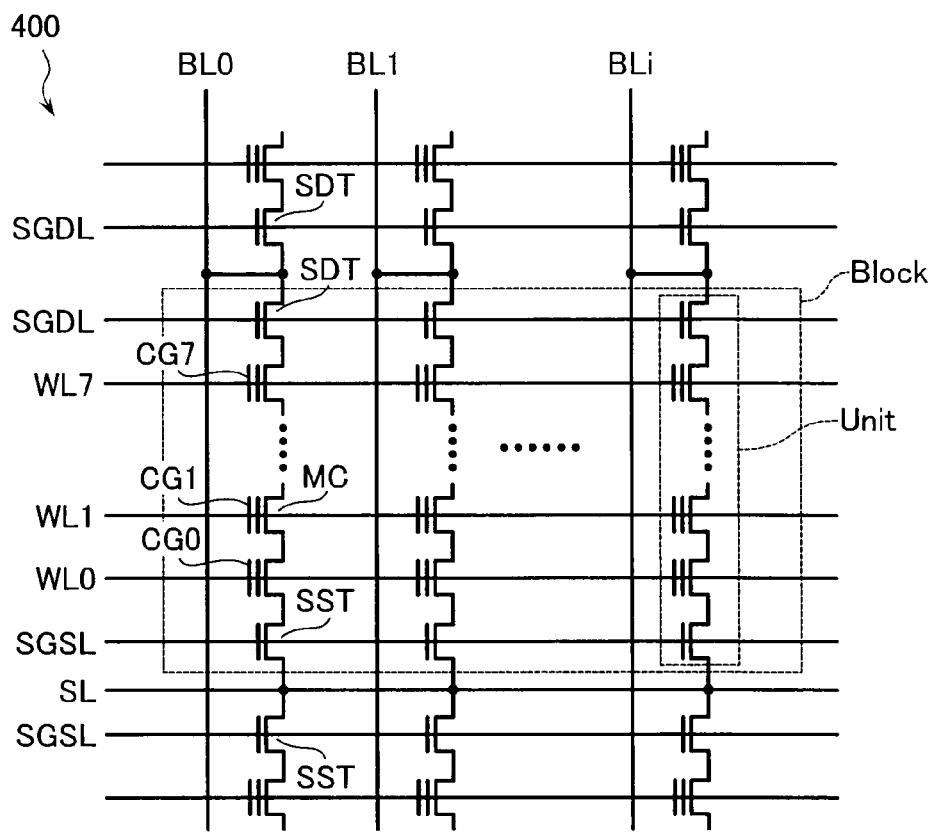
FIG. 2 is a circuit diagram of the memory cell array 400 in the non-volatile semiconductor storage device according to the first embodiment of the present invention.

Referring now to FIG. 2, a circuit configuration of the memory cell array 400 will be described below. The memory cell array 400 is a so-called NAND-type flash memory.

As illustrated in FIG. 2, one unit which is a unit of erasing data includes a plurality of memory cells MC connected in series to each other, a source-side selection transistor SST connected in series to one end (source side) of the memory cells MC, and a drain-side selection transistor SDT connected in series to the other end (drain side) of the memory cells MC. Note that, in the example of FIG. 2, eight memory cells MC are connected in series. In addition, while the eight memory cells MC are illustrated in FIG. 2, it may of course be possible to provide any other number of memory cells.

Word lines WL are connected to control gates CG0 to CG7 of the memory cell transistors as the memory cells MC. The gate terminal of the source-side selection transistor SST is connected to a source-side selection gate line SGSL. The source terminal of the source-side selection transistor SST is connected to a source line SL. The gate terminal of the drain-side selection transistor SDT is connected to a drain-side selection gate line SGDL. The drain terminal of the drain-side selection transistor SDT is connected to a bit line BL.

The source-side selection gate line SGSL and the drain-side selection gate line SGDL are used to on-off control the selection transistors SST and SDT. The source-side selection transistor SST and the drain-side selection transistor SDT function as the gates for supplying a predetermined potential to the memory cells MC in the unit, e.g., when writing and reading data.

A plurality of such units are arranged in the row direction (to which the word lines extend) to configure one block.

Those memory cells that are connected to the same word line in one block are taken as one page and data writing and reading operations are performed on a per page basis.

Multiple blocks are arranged in the column direction (to which the bit lines extend). In addition, respective multiple blocks are arranged in an folded structure. That is, any one block and another block adjacent to one end thereof have respective drain-side selection transistors SDT arranged adjacent to each other. The one block and still another block adjacent to the other end thereof have respective source-side selection transistors SST arranged adjacent to each other.

(Specific Configuration of Non-Volatile Semiconductor Storage Device According to First Embodiment)

Figure 3:
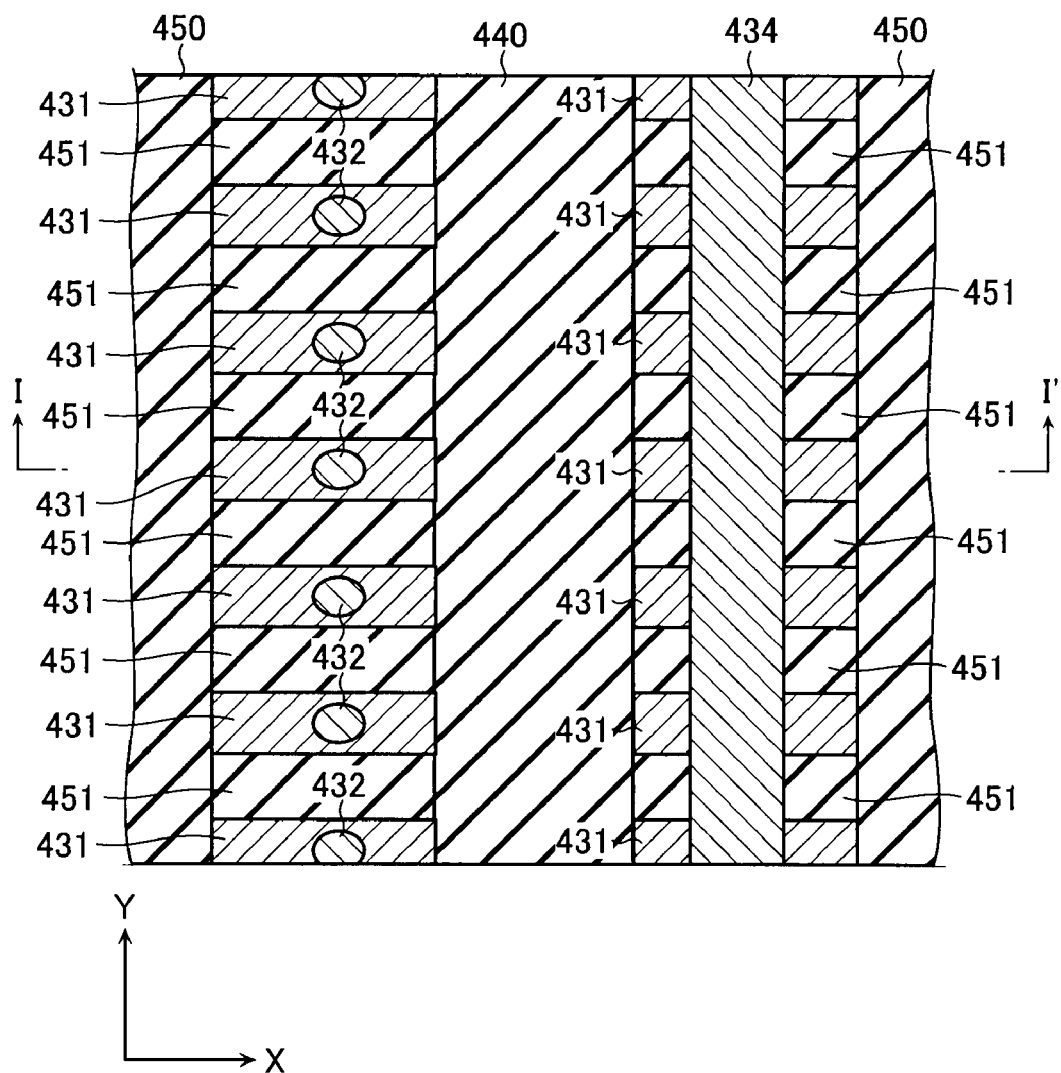
FIG. 3 is a top plan view illustrating a specific configuration of the non-volatile semiconductor storage device according to the first embodiment of the present invention.
Figure 4:
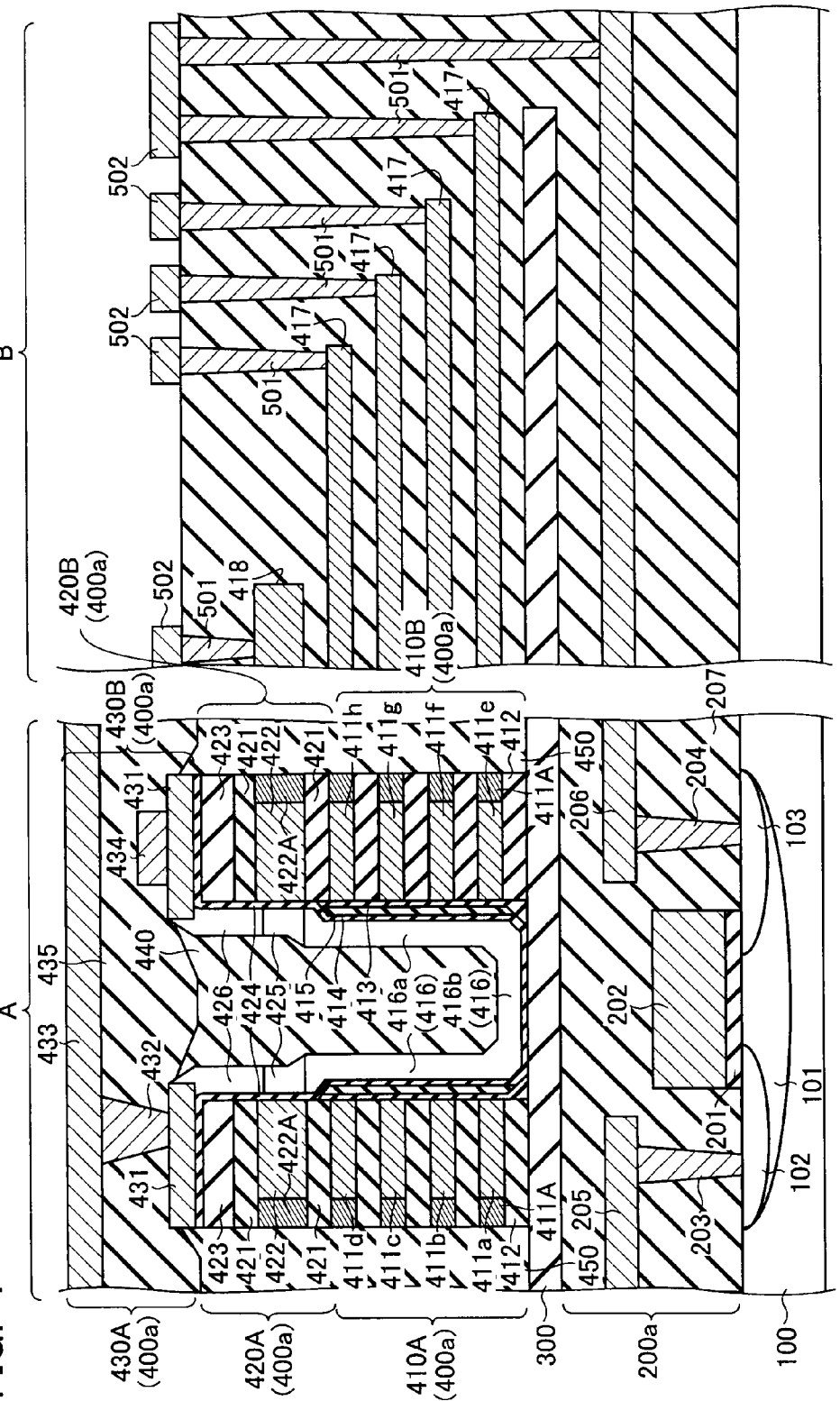
FIG. 4 is a cross-sectional view, taken along line I-I' of FIG. 3, illustrating a specific configuration of the non-volatile semiconductor storage device according to the first embodiment of the present invention.

Referring now to FIGS. 3 and 4, a specific configuration of the non-volatile semiconductor storage device according to the first embodiment will be described below. FIG. 3 is a top plan view of the non-volatile semiconductor storage device according to the first embodiment; and FIG. 4 is a cross-sectional view taken along line I-I' of FIG. 3. FIG. 3 illustrates the memory cell array 400 part (operation area A) and the surrounding edge area B. Note that a bit line BL (a wiring layer 433, discussed below) provided above these areas and an insulation layer 435, which will be later described, are omitted from FIG. 3. In FIGS. 3 and 4, consider that one direction to which the bit lines BL extend represents the x direction and the other to which the source line SL (a wiring layer 434, discussed below) extends represents the y direction.

As illustrated in FIG. 4, the non-volatile semiconductor storage device according to the first embodiment has the following two areas: an operation area A that operates as a transistor, etc., and an edge area B that corresponds to the edge portion of the operation area A. As described above, the non-volatile semiconductor storage device has such a configuration where a control circuit layer 200a that configures the control circuit 200, the support layer 300, and a memory cell array layer 400a that configures the memory cell array 400 are sequentially (from the bottom) laminated on the substrate 100 in the operation area A.

The substrate 100 has on its surface at least one base area 101 and a pair of source/drain areas 102 and 103. The source/drain areas 102 and 103 function as the source/drain of a transistor included in the control circuit layer 200a. For example, the base area 101 is configured by a p-type semiconductor and the source/drain areas 102 and 103 are configured by n-type semiconductors. The base area 101 may also be configured by an n-type semiconductor and the source/drain areas 102 and 103 may be configured by p-type semiconductors.

The control circuit layer 200a has a gate insulation layer 201 that is formed across the source/drain areas 102 and 103 on the top surface of the substrate 100 and a gate electrode layer 202 that is formed on the gate insulation layer 201. In addition, the control circuit layer 200a has source/drain contact layers 203 and 204 that are provided in contact with the top surface of each of the source/drain areas 102 and 103 and extend to the lamination direction, and wiring layers 205 and 206 that are connected to the source/drain contact layers 203 and 204, respectively. Note that an interlayer insulation layer 207 is provided up to the upper position of the wiring layers 205 and 206. The source/drain contact layers 203 and 204 are composed of, e.g., polysilicon. The source/drain contact layers 203 and 204 may also be composed of such material that has a higher melting point than that of polysilicon.

The support layer 300 is composed of such material that has a higher selectivity for etching than that of the memory cell array layer 400a. More specifically, the support layer 300 is composed of such material that prevents the support layer 300 from being etched when etching the memory cell array layer 400a. The support layer 300 is composed of, e.g., alumina ($Al_2O_3$).

The memory cell array layer 400a is a NAND-type flash memory with a SOI (Silicon On Insulator) structure. In addition, vertical memory cell transistors and vertical selection transistors are used as the memory cells MC and the selection transistors SST and SDT of the first embodiment. Note that vertical transistors represent those transistors with trenches formed in the vertical direction (lamination direction).

In the memory cell array layer 400a, a pair of first lamination parts 410A and 410B are formed on the support layer 300. A second lamination part 420A and a third lamination part 430A are laminated on the first lamination part 410A. Similarly, a second lamination part 420B and a third lamination part 430B are laminated on a first lamination part 410B. Note that the first lamination part 410A (the second lamination part 420A and the third lamination part 430A) and the first lamination part 410B (the second lamination part 420B and the third lamination part 430B) are formed to be spaced apart by a predetermined distance in the x direction. Insulation layers 440 and 450 are deposited around the circumference of the first lamination part 410A (the second lamination part 420A and the third lamination part 430A) and the first lamination part 410B (the second lamination part 420B and the third lamination part 430B).

The first lamination part 410A is formed with alternately laminated first interlayer insulation layers (first insulation layers) 412 and first conductive layers 411a to 411d (from the bottom). The first lamination part 410B is formed with alternately laminated first interlayer insulation layers (first insulation layers) 412 and first conductive layers 411e to 411h (from the bottom). The first conductive layers 411a to 411h function as the control gates CG0 to CG7 of the memory cells MC mentioned above.

In addition, each of the first lamination parts 410A and 410B has a block insulation layer (third insulation layer) 413, a charge accumulation layer 414, a tunnel insulation layer (fourth insulation layer) 415, and an n⁻ type semiconductor layer (first semiconductor layer) 416, in a respective side surface where each of the first lamination parts 410A and 410B faces each other through the insulation layer 440, which will be later described.

For example, polysilicon is used for the first conductive layers 411a to 411h. In addition, tantalum (Ta), tungsten (W), aluminum (Al), copper (Cu) or the like may be used to lower the resistance of the control gates. The first conductive layers 411a to 411d and the first conductive layers 411e to 411h have silicide layers 411A at their respective ends opposed to the end where the first lamination parts 410A and 410B face each other in the x direction.

For example, silicon oxide ($SiO_2$) is used for the first interlayer insulation layers 412. Alternatively, boron (B)- and phosphorus (P)-doped silicon oxide may be used for BPSG (Boron Phosphorus Silicate Glass), BSG (Boron Silicate Glass), PSG (Phosphorus Silicate Glass) or the like.

The block insulation layer 413 is formed in contact with the respective sidewalls of the first conductive layers 411a to 411d, 411e to 411h and the first interlayer insulation layers 412. The block insulation layer 413 prevents charges accumulated in the charge accumulation layer 414 from being diffused into the gate electrodes. For example, silicon oxide ($SiO_2$) or aluminum oxide ($Al_2O_3$) is used for the block insulation layer 413. The block insulation layer 413 has a film thickness on the order of 10-15 nm.

The charge accumulation layer 414 is provided in contact with the block insulation layer 413 and formed to accumulate charges. For example, silicon nitride (SiN) is used for the charge accumulation layer 414. The charge accumulation layer 414 has a film thickness on the order of 4-10 nm.

The tunnel insulation layer 415 is provided in contact with the charge accumulation layer 414. The tunnel insulation layer 415 become potential barriers when charges from the $n^-$ type semiconductor layer 416 are accumulated in the charge accumulation layer 414 or when the charges accumulated in the charge accumulation layer 414 are diffused into the $n^-$ type semiconductor layer 416. For example, silicon oxide ($SiO_2$) is used for the tunnel insulation layer 415. Silicon oxide is preferable for its better insulating properties than silicon nitride and its functionality of preventing charge diffusion. The tunnel insulation layer 415 has a film thickness on the order of 4 nm.

That is, the block insulation layer 413, the charge accumulation layer 414, and the tunnel insulation layer 415 together configure oxide film, nitride film, oxide film, for example ONO laminated film.

The $n^-$ type semiconductor layer 416 has a U-shaped cross-section in the direction of I-I'. That is, the $n^-$ type semiconductor layer 416 has side parts 416a, 416a that are provided in contact with each tunnel insulation layer 415 and formed to extend to the lamination direction (in a pillar-like fashion), and a bottom part 416b that is formed to connect the bottom portions of the pair of side parts 416a, 416a. The side parts 416a, 416a are formed up to the top surfaces of third interlayer insulation layers 423 that are located in the upper part of the memory cell array layers 400a, as discussed below. Note that the $n^-$ type semiconductor layer 416 is configured by a semiconductor layer to which a low-concentration $n^-$ type impurity is implanted.

Each of the second lamination parts 420A and 420B has such a configuration where a second interlayer insulation layer 421, a second conductive layer 422, another second interlayer insulation layer 421, and a third interlayer insulation layer 423 are sequentially laminated therein. In other words, each second conductive layer 422 is laminated between the second interlayer insulation layers 421. One second conductive layer 422 in the second lamination part 420A functions as a drain-side selection gate line SGDL of a drain-side selection transistor SDT. In addition, the other second conductive layer 422 in the second lamination part 420B functions as a source-side selection gate line SGSL of a source-side selection transistor SST.

In addition, each of the second lamination parts 420A and 420B has a gate insulation layer (fifth insulation layer) 424, a $p^-$ type semiconductor layer (second semiconductor layer) 425, and an $n^+$ type semiconductor layer 426, in a respective side surface where the second conductive layers 422 face each other through the insulation layer 440.

For example, polysilicon is used for the second conductive layers 422. In addition, tantalum (Ta), tungsten (W), aluminum (Al), copper (Cu) or the like may be used to lower the resistance of the control gates. Each of the second conductive layers 422 has a silicide layer 422A at a respective end opposed to the end where the second lamination parts 420A and 420B face each other in the x direction.

For example, silicon oxide ($SiO_2$) is used for the second interlayer insulation layers 421. Alternatively, BPSG (Boron Phosphorus Silicate Glass) including boron (B) or phosphorus (P) in silicon oxide, BSG (Boron Silicate Glass), PSG (Phosphorus Silicate Glass) or the like.

The gate insulation layer 424 is provided in contact with the respective sidewalls of the second conductive layers 422, the second interlayer insulation layers 421, and the third interlayer insulation layers 423. The $p^-$ type semiconductor layers 425 are provided in contact with the gate insulation layer 424 and the $n^-$ type semiconductor layer 416, within a region from the bottom to the top surfaces of the second conductive layers 422 in the lamination direction. The $p^-$ type semiconductor layers 425 are formed to extend to the lamination direction. The $p^-$ type semiconductor layers 425 are semiconductor layers to which low-concentration $p^-$ type impurities are implanted. The $n^+$ type semiconductor layers 426 are provided in contact with the gate insulation layer 424 and the top surfaces of the $p^-$ type semiconductor layers 425.

Each of the third lamination parts 430A and 430B has a contact layer 431 that is formed on the respective third interlayer insulation layer 423 via the respective tunnel insulation layer 415.

One end of each contact layer 431 is formed in contact with the upper portion of the respective $n^+$ type semiconductor layer 426. Each contact layer 431 is formed in a rectangular plate shape, taking the x direction as the longitudinal direction. Each contact layer 431 is configured by a silicide layer.

Further, the third lamination part 430A has a contact plug layer 432 that is provided on the top surface of the contact layer 431 and a wiring layer 433 that is provided on the top surface of the contact plug layer 432. The contact plug layer 432 is formed on the top surface of one contact layer 431 and formed to extend to the lamination direction. The wiring layer 433 is formed across, and in contact with, the top surfaces of the contact plug layers 432 in multiple third lamination parts 430A. The wiring layer 433 functions as the above-mentioned bit line BL.

In addition, the third lamination part 430B has a wiring layer 434 that is provided on the top surface of the other contact layer 431. The wiring layer 434 is formed on the top surface of the other contact layer 431. The wiring layer 434 is formed across, and in contact with, the top surfaces of the contact layers 431 in multiple second lamination parts 420B. The wiring layer 434 functions as the above-mentioned source line SL. Note that an insulation layer 435 is formed between the bottom surface of the wiring layer 433 and the insulation layers 440, 450 in the operation area A.

The edge of the wiring layer 206 is formed in the edge area B. In addition, for example, the edges of wiring layers 417 connected to the first conductive layers 411a to 411h are formed in the edge area B. Further, for example, the edge of a wiring layer 418 connected to a second conductive layer 422 is formed in the edge area B. Contact plug layers 501 that extend to the lamination direction are formed on the edges of the wiring layer 206, the wiring layers 417, and the wiring layer 418. Wiring layers 502 are formed on the upper end of each of the contact plug layers 501. In addition, for example, the wiring layer 206 is connected via the contact plug layers 501 and the wiring layers 417 to any one of the first conductive layers 411a to 411h. The wiring layers 417 function as the above-mentioned word lines WL0 to WL7.

(Manufacturing Process of Non-Volatile Semiconductor Storage Device according to First Embodiment)

Referring now to FIGS. 5A, 6A, 7A, 8A, 9A, 10A, 11A, 11C, 12A, 13A, and 14A, as well as FIGS. 5B, 6B, 7B, 8B, 9B, 10B, 11B, 11D, 12B, 13B, and 14B, a manufacturing process of the non-volatile semiconductor storage device according to the first embodiment will be described below. FIGS. 5A, 6A, 7A, 8A, 9A, 10A, 11A, 11C, 12A, 13A, and 14A are top plan views in the manufacturing process; and FIGS. 5B, 6B, 7B, 8B, 9B, 10B, 11B, 11D, 12B, 13B, and 14B are cross-sectional views in the manufacturing process.

Figure 5A:
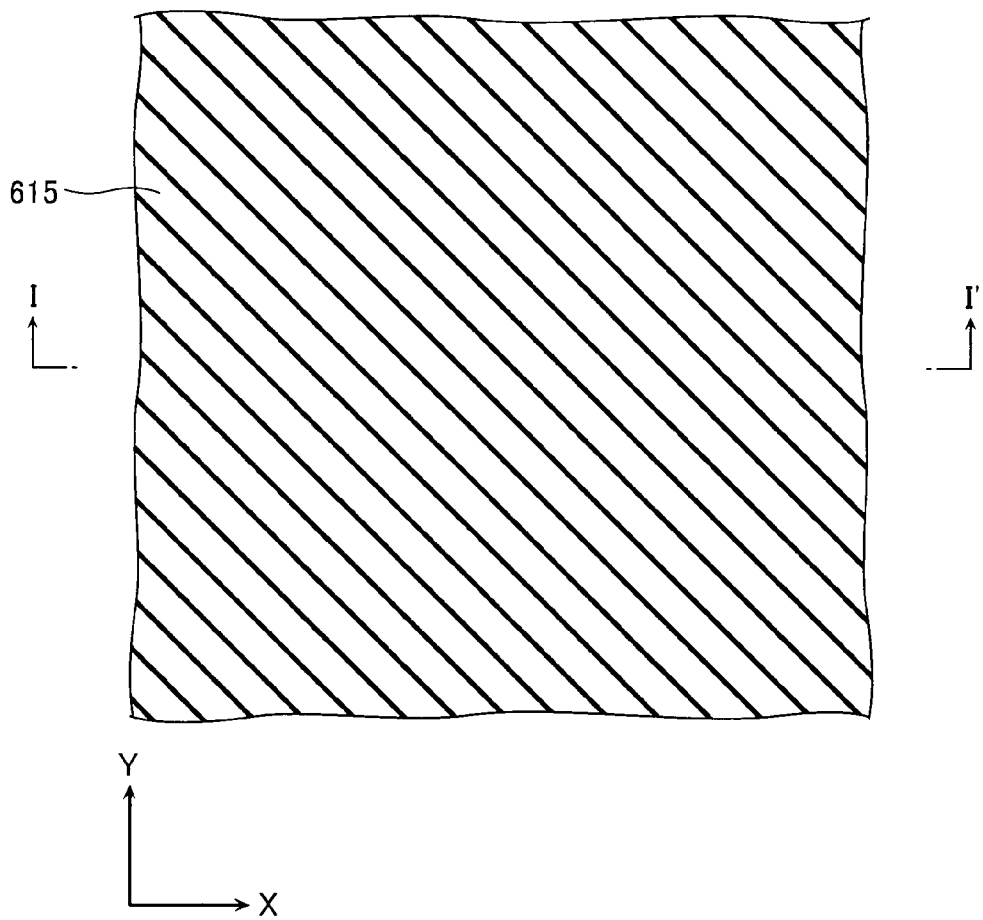
FIG. 5A is a top plan view illustrating a manufacturing process of the non-volatile semiconductor storage device according to the first embodiment of the present invention.
Figure 5B:
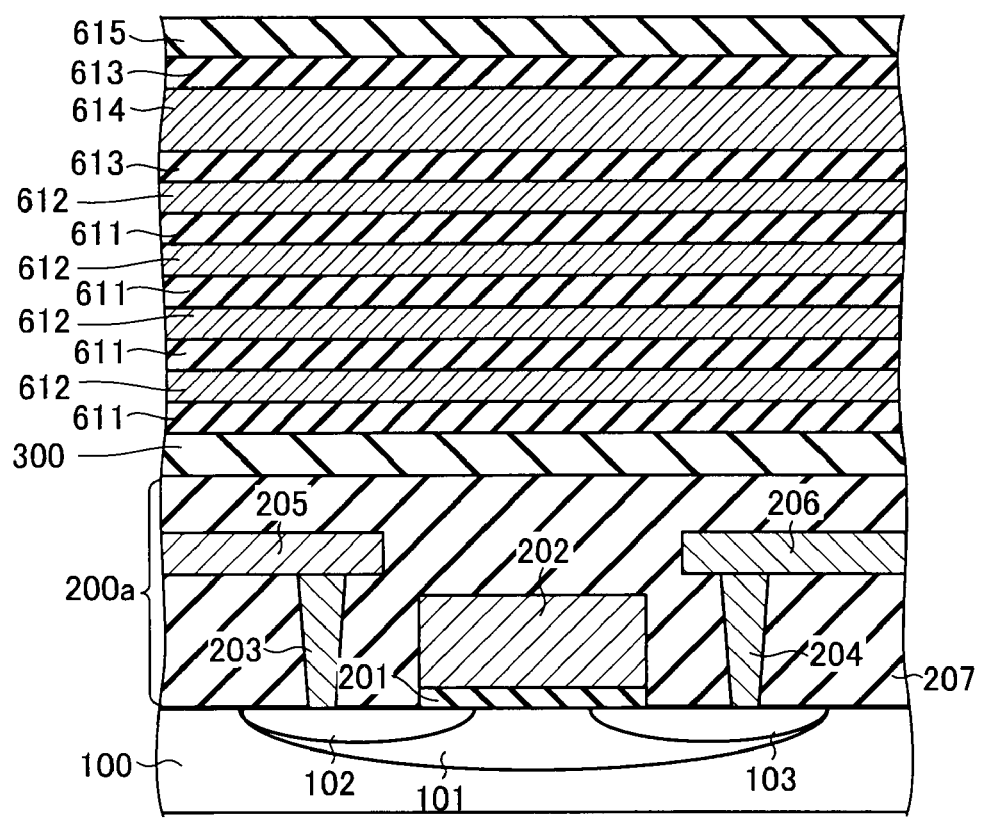
FIG. 5B is a cross-sectional view, taken along line I-I' of FIG. 5A, illustrating a manufacturing process of the non-volatile semiconductor storage device according to the first embodiment of the present invention.

Firstly, as illustrated in FIGS. 5A and 5B, the control circuit layer 200a and the support layer 300 are laminated on the substrate 100, and then interlayer insulation layers 611 and first conductive layers 612 are alternately laminated thereon. Then, an interlayer insulation layer 613, a second conductive layer 614, another interlayer insulation layer 613, and still another interlayer insulation layer 615 are sequentially laminated thereon.

Each of the interlayer insulation layers 611 and each of the first conductive layers 612 are subsequently processed to provide the first conductive layers 411a to 411h that function as the first interlayer insulation layers 411 and the control gates CG0 to CG7. In addition, the interlayer insulation layers 613 and the second conductive layer 614 are subsequently processed to provide the second interlayer insulation layers 421 and the second conductive layers 422 that function as the selection gate lines SGDL (SGSL) of the selection transistor.

For example, in the first embodiment, polysilicon is used for the first conductive layers 612 and the second conductive layer 614. In addition, for example, silicon oxide is used for the interlayer insulation layers 611 and the interlayer insulation layers 613, in which tantalum (Ta), tungsten (W), aluminum (Al), copper (Cu) or the like may be used to lower the resistance of the control gates CG. Alternatively, boron (B)- and phosphorus (P)-doped silicon oxide may be used for BPSG (Boron Phosphorus Silicate Glass), BSG (Boron Silicate Glass), PSG (Phosphorus Silicate Glass) or the like.

Figure 6A:
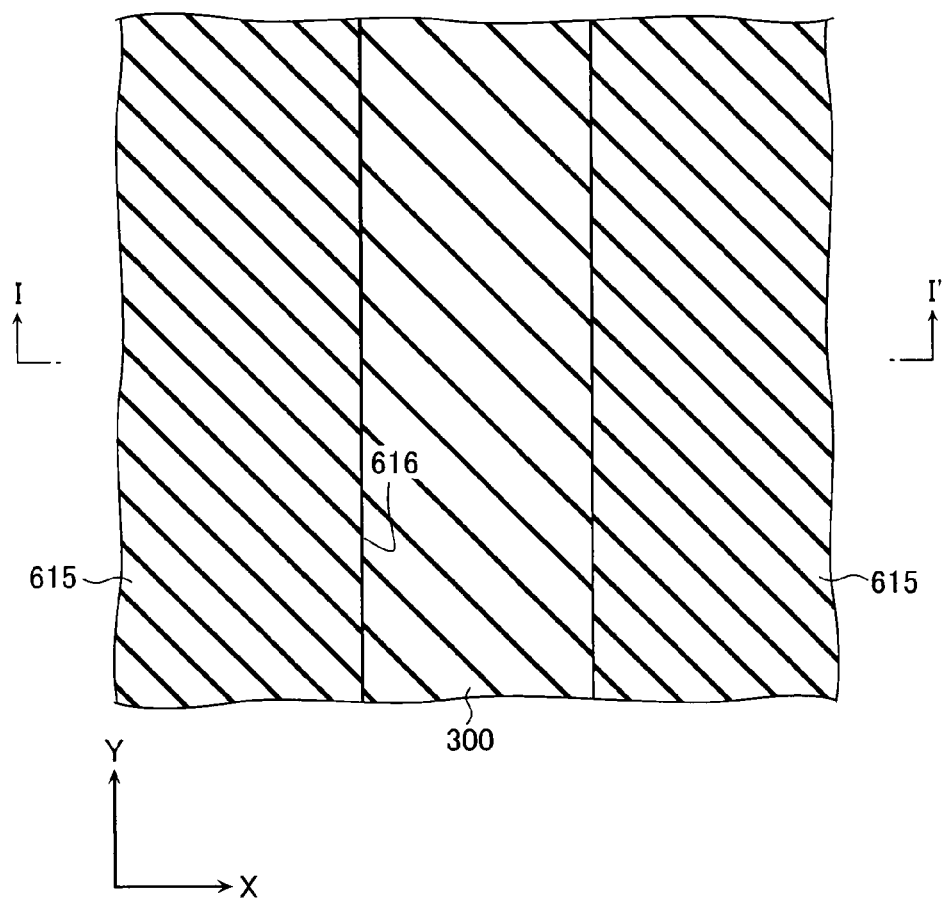
FIG. 6A is a top plan view illustrating a manufacturing process of the non-volatile semiconductor storage device according to the first embodiment of the present invention.
Figure 6B:
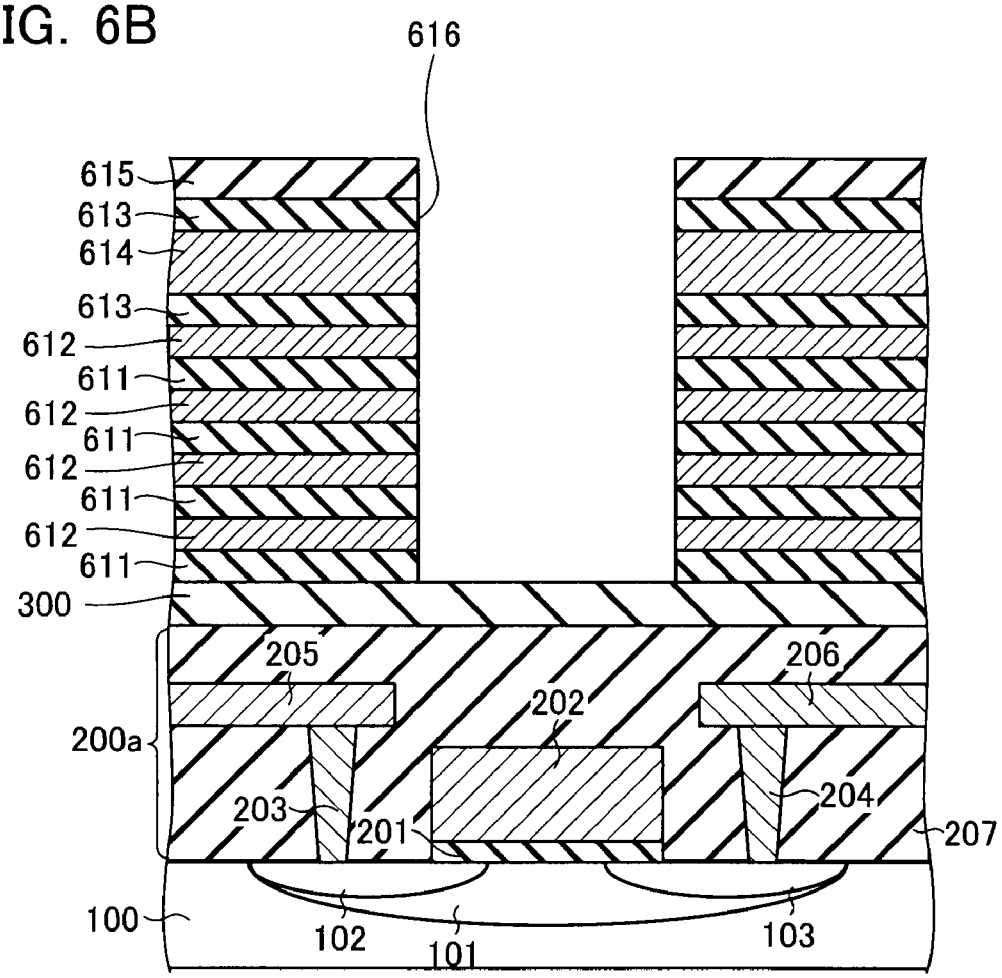
FIG. 6B is a cross-sectional view, taken along line I-I' of FIG. 6A, illustrating a manufacturing process of the non-volatile semiconductor storage device according to the first embodiment of the present invention.

Then, as illustrated in FIGS. 6A and 6B, the first conductive layers 612, the second conductive layer 614, and the interlayer insulation layers 611, 613, 615 are selectively etched using lithography and RIE (Reactive Ion Etching) methods. Then, an aperture 616 is formed to penetrate the laminated first conductive layers 612, second conductive layer 614, and interlayer insulation layers 611, 613, 615 so that the top surface of the support layer 300 is exposed. Wherein, the support layer 300 is composed of such material that has a higher selectivity for etching than that of the memory cell array layer 400a (labeled 611 to 615). Thus, the support layer 300 will not be etched when forming the aperture 616.

Figure 7A:
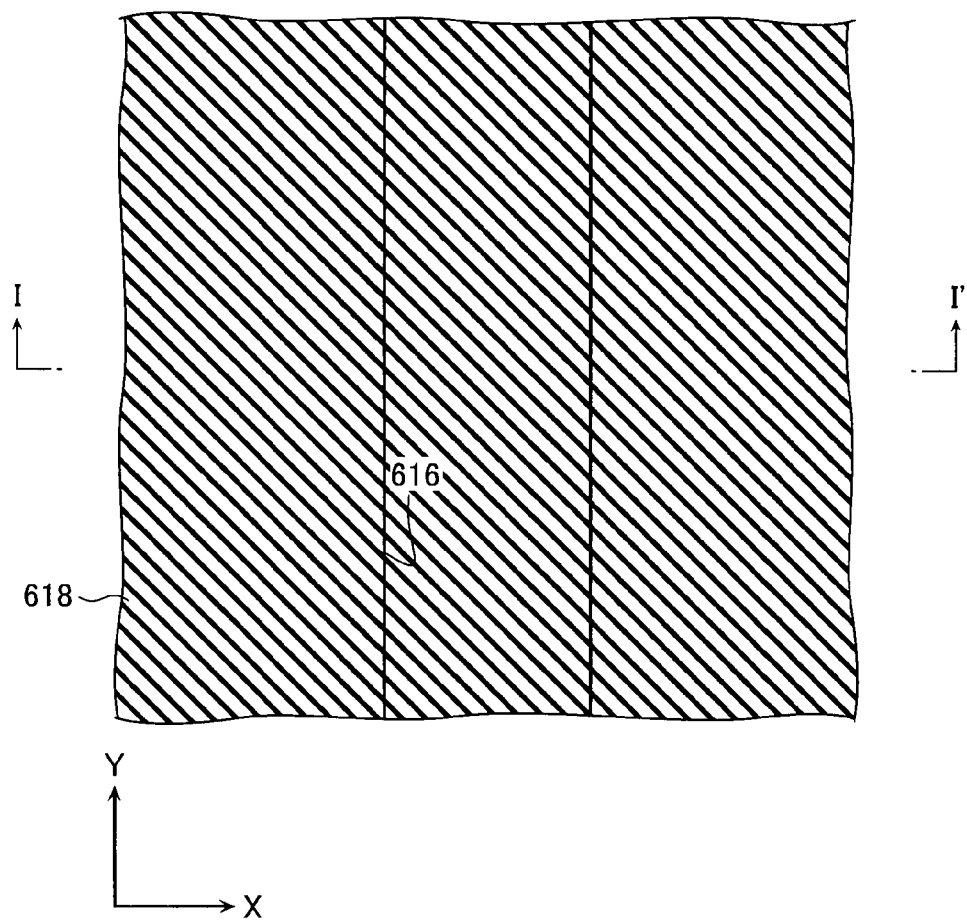
FIG. 7A is a top plan view illustrating a manufacturing process of the non-volatile semiconductor storage device according to the first embodiment of the present invention.

Then, as illustrated in FIGS. 7A and 7B, a silicon oxide film 617 and a silicon nitride film 618 are sequentially deposited on the respective side surfaces, facing the aperture 616, of the first conductive layers 612, the second conductive layer 614, and the interlayer insulation layers 611, 613, 615. At this moment, the silicon oxide film 617 and the silicon nitride film 618 are also formed on the support layer 300 facing the aperture 616. Note that the silicon oxide film 617 and the silicon nitride film 618 are subsequently processed to provide the block insulation layer 413 and the charge accumulation layer 414.

Figure 8A:
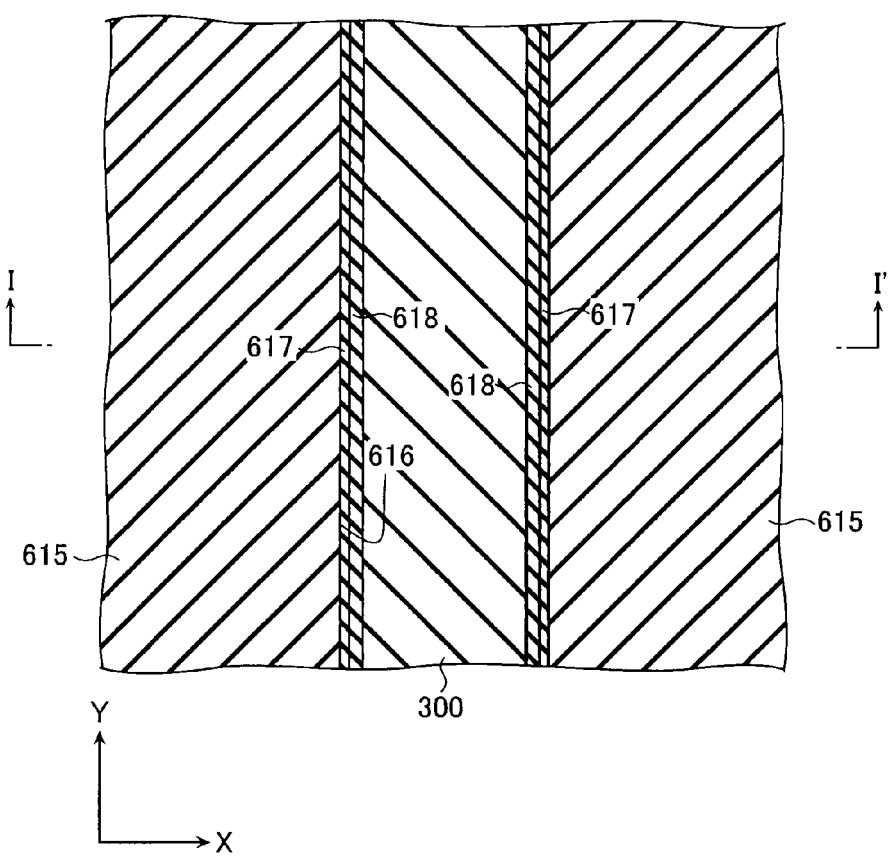
FIG. 8A is a top plan view illustrating a manufacturing process of the non-volatile semiconductor storage device according to the first embodiment of the present invention.
Figure 8B:
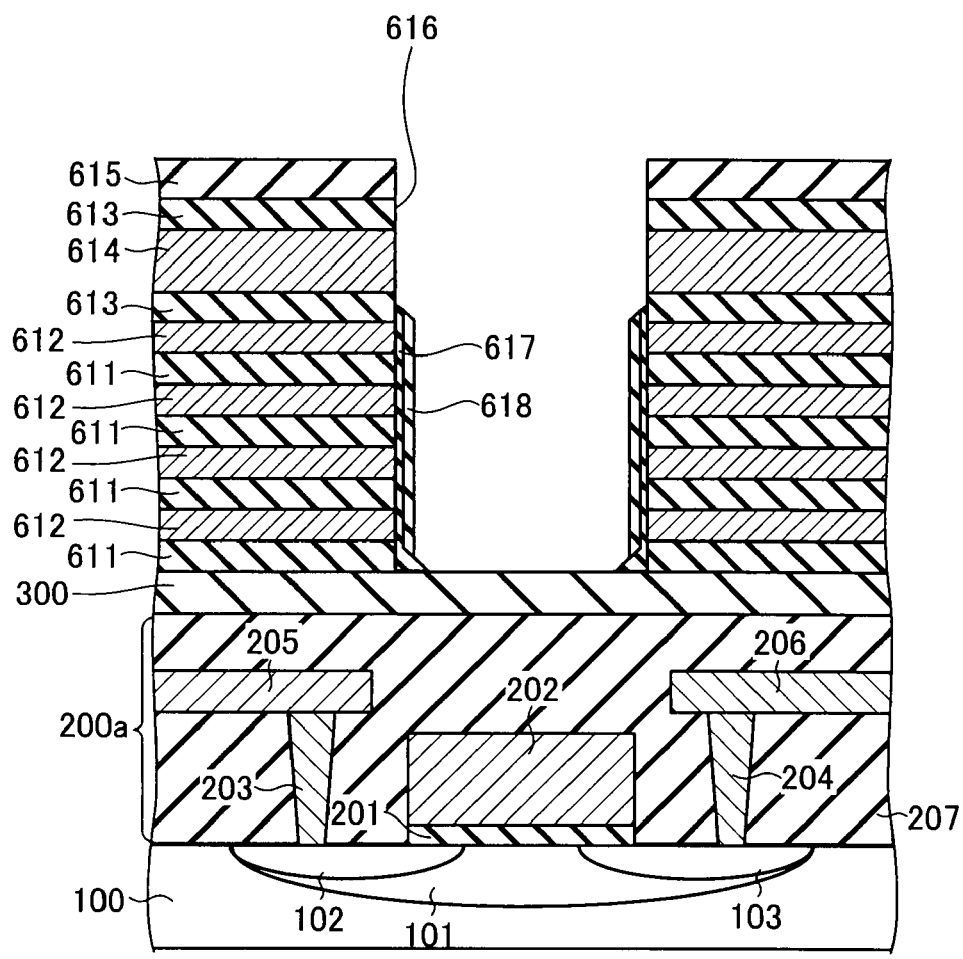
FIG. 8B is a cross-sectional view, taken along line I-I' of FIG. 8A, illustrating a manufacturing process of the non-volatile semiconductor storage device according to the first embodiment of the present invention.

Then, as illustrated in FIGS. 8A and 8B, those portions of the silicon nitride film 618 and the silicon oxide film 617 are etched that are formed above the top surface of the insulation layer 613. At the same time, those portions of the silicon nitride film 618 and the silicon oxide film 617 are etched, that reside in the bottom surface of the aperture 616, exposing the support layer 300. Note that the support layer 300 will not be etched since it is composed of such material that has a higher selectivity for etching than that of the memory cell array layer 400a (labeled 611 to 615), as mentioned above.

Figure 9A:
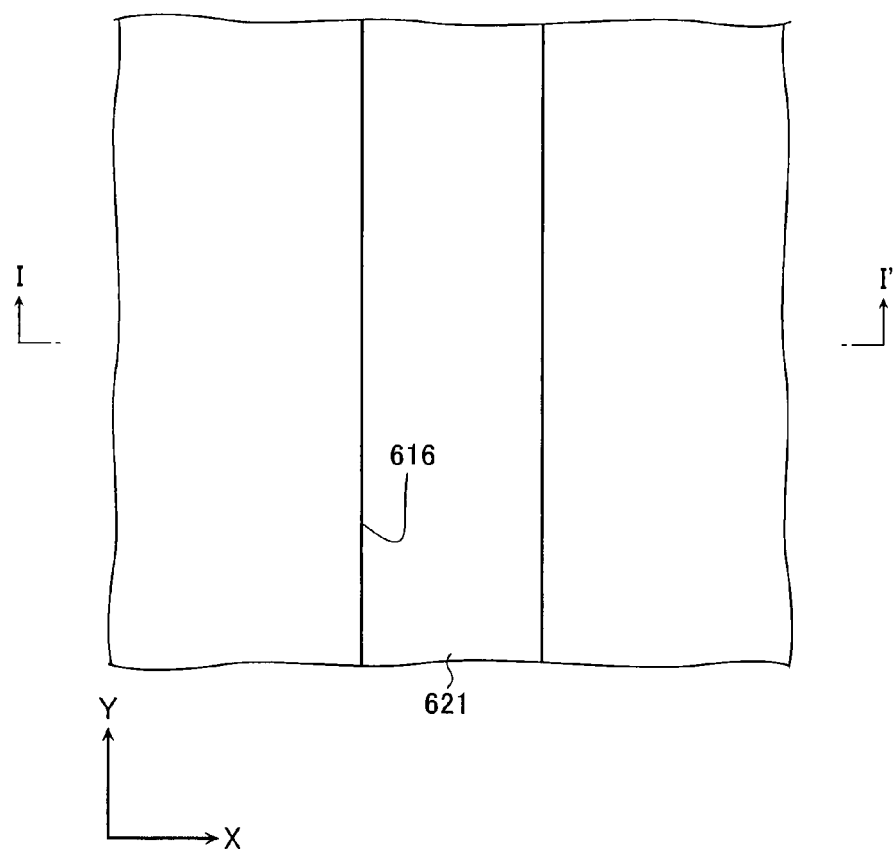
FIG. 9A is a top plan view illustrating a manufacturing process of the non-volatile semiconductor storage device according to the first embodiment of the present invention.
Figure 9B:
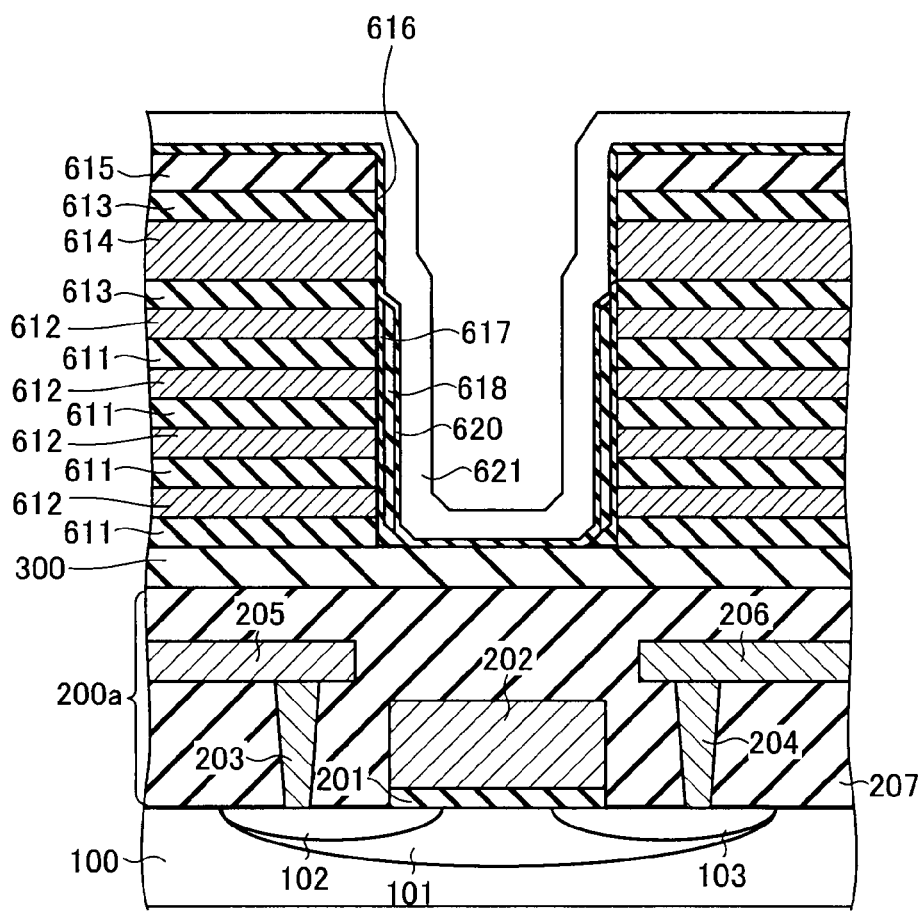
FIG. 9B is a cross-sectional view, taken along line I-I' of FIG. 9A, illustrating a manufacturing process of the non-volatile semiconductor storage device according to the first embodiment of the present invention.

Then, as illustrated in FIG. 9A and FIG. 9B, a silicon oxide film 620 is deposited on the silicon nitride film 618, the side surfaces of the interlayer insulation layers 613, 615, and the side surface of the second conductive layer 614. At this moment, the silicon oxide film 620 is also formed on the support layer 300 facing the aperture 616. Note that the silicon oxide film 620 is subsequently processed to provide the gate insulation layer 424 and the tunnel insulation layer 415. Subsequently, an n⁻ type semiconductor layer 621 is deposited on the silicon oxide film 620 and on its side surface. For the n⁻ type semiconductor layer 621, such silicon is used to which a low-concentration n⁻ type impurity (such as phosphorus (P) or arsenic (As)) is implanted. Note that the n⁻ type semiconductor layer 621 becomes the n⁻ type semiconductor layer 416 after the following process.

Figure 10A:
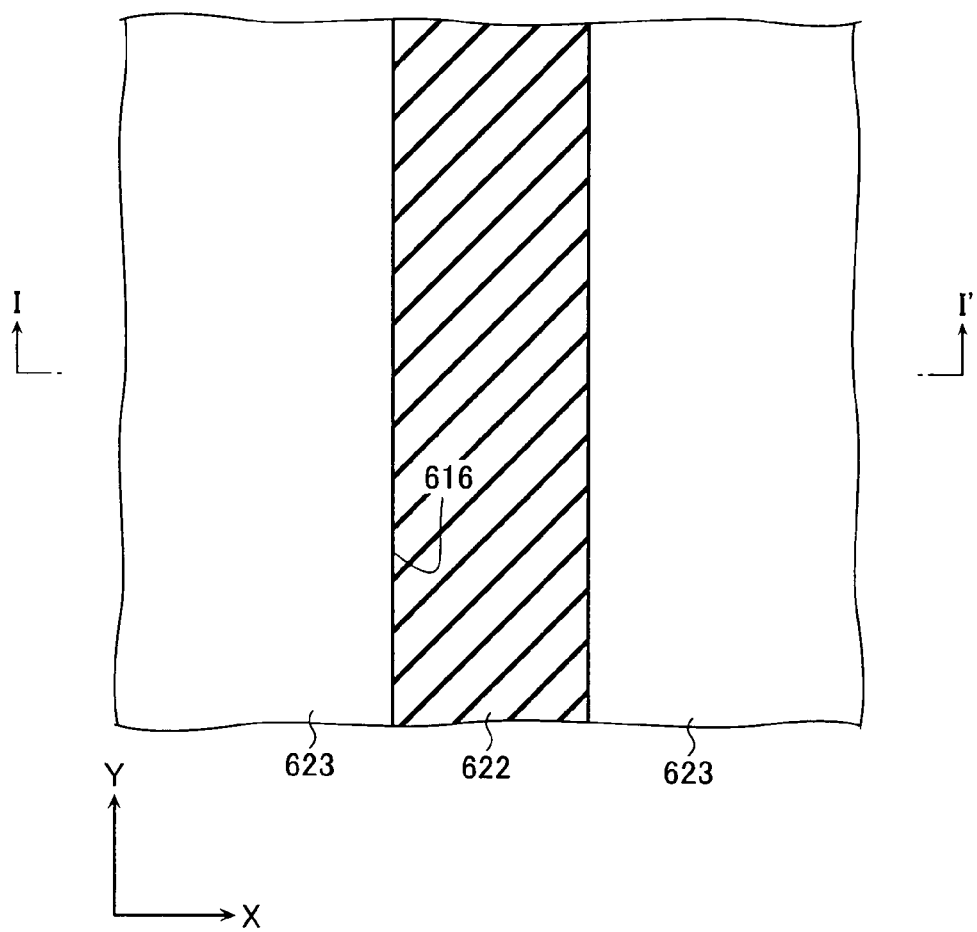
FIG. 10A is a top plan view illustrating a manufacturing process of the non-volatile semiconductor storage device according to the first embodiment of the present invention.
Figure 10B:
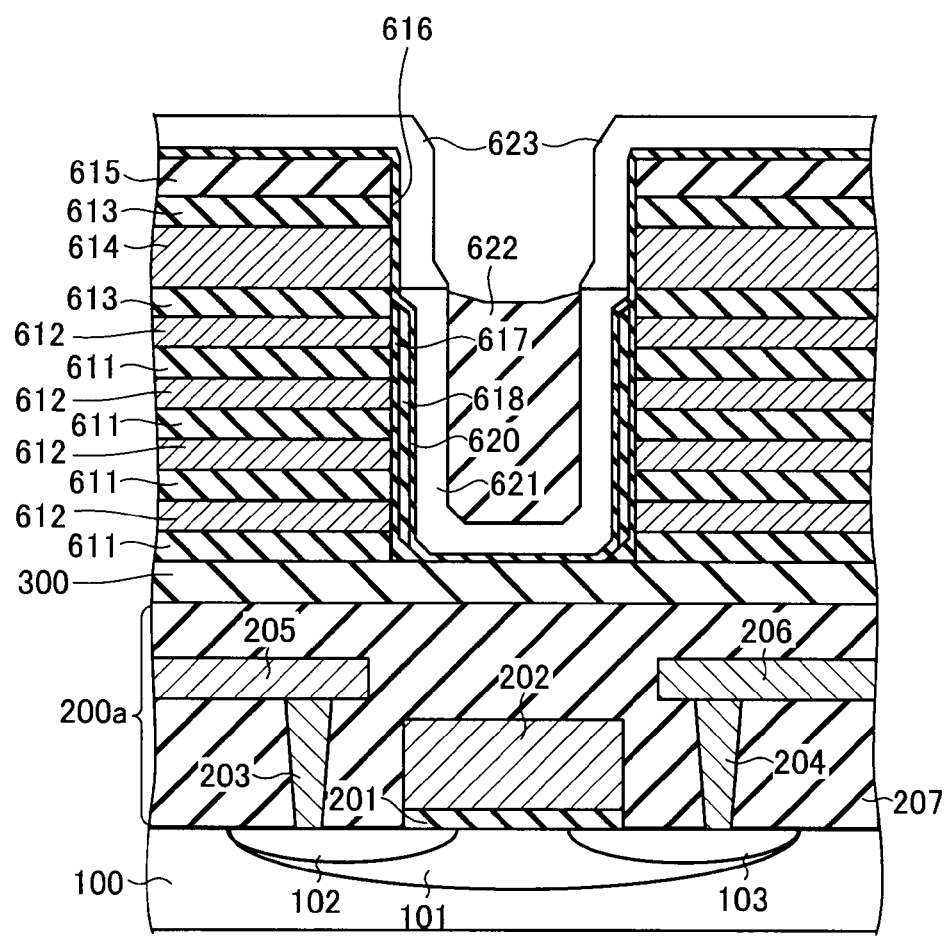
FIG. 10B is a cross-sectional view, taken along line I-I' of FIG. 10A, illustrating a manufacturing process of the non-volatile semiconductor storage device according to the first embodiment of the present invention.

Then, as illustrated in FIGS. 10A and 10B, an insulation layer 622 is deposited on the n⁻ type semiconductor layer 621 so as to fill up the aperture 616. At this moment, the top surface of the insulation layer 622 is set at substantially the same position as the bottom surface of the second conductive layer 614. For example, silicon oxide is used for the insulation layer 622. Subsequently, a low-concentration p⁻ type impurity (such as boron (B)) is implanted to those portions of the n⁻ type semiconductor layer 621 that are formed above the top surface of the insulation layer 622. As a result, p⁻ type semiconductor layers 623, 623 are formed within the n⁻ type semiconductor layer 621 above the top surface of the insulation layer 622, as channel regions of the selection transistors SST, SDT. Note that the p⁻ type semiconductor layers 623, 623 become the p⁻ type semiconductor layers 425, 425 after the following process.

Figure 11A:
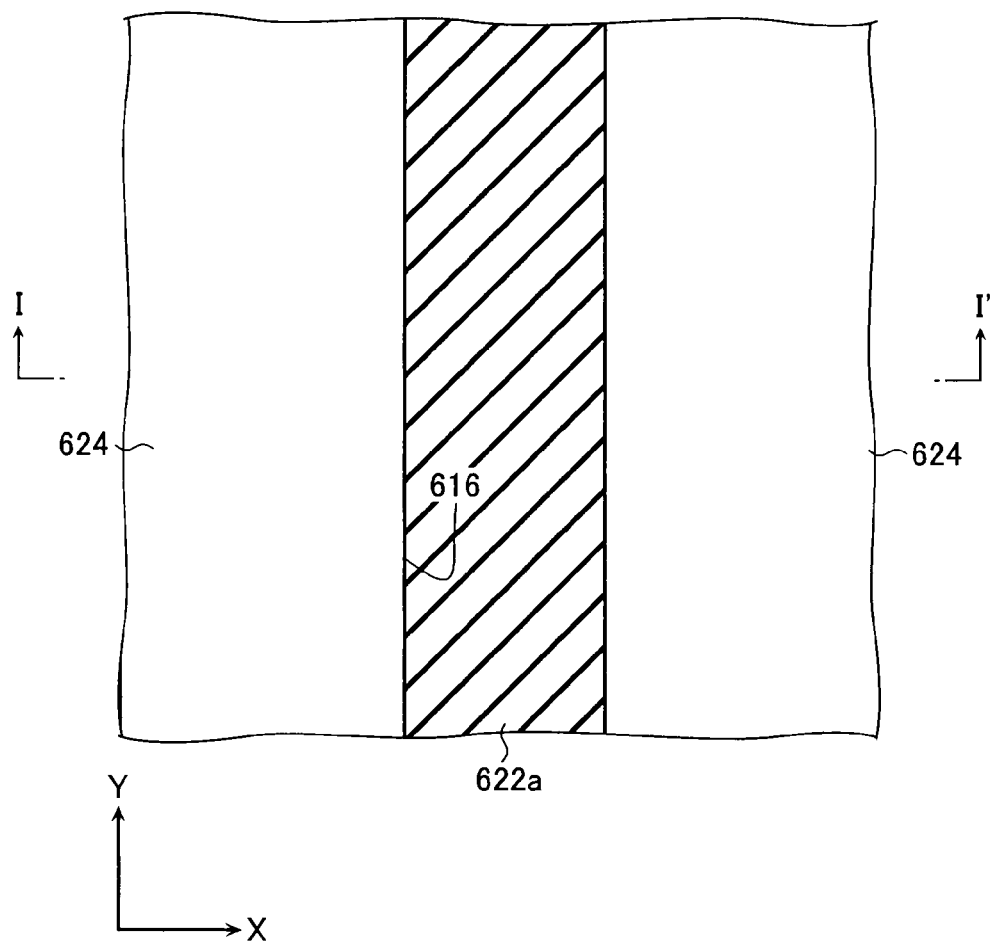
FIG. 11A is a top plan view illustrating a manufacturing process of the non-volatile semiconductor storage device according to the first embodiment of the present invention.
Figure 11B:
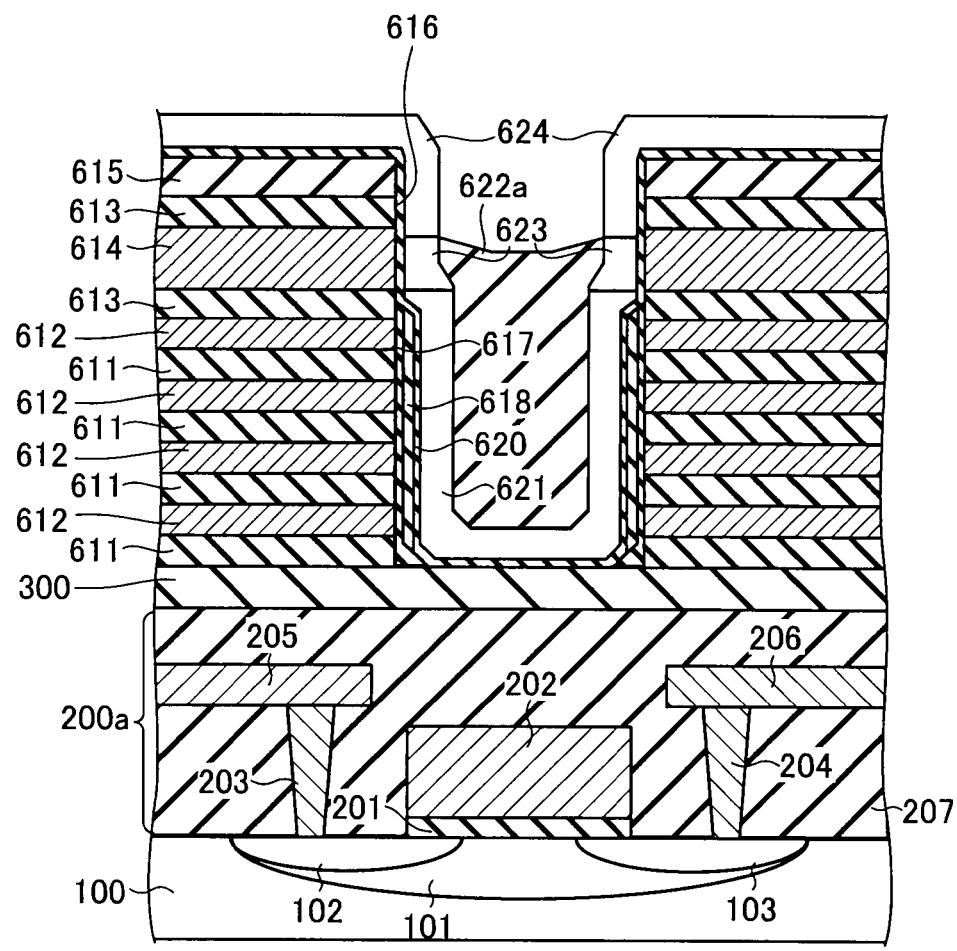
FIG. 11B is a cross-sectional view, taken along line I-I' of FIG. 11A, illustrating a manufacturing process of the non-volatile semiconductor storage device according to the first embodiment of the present invention.

Then, as illustrated in FIGS. 11A and 11B, an insulation layer 622a is further deposited on the insulation layer 622. At this moment, the top surface of the insulation layer 622a is set at substantially the same position as the top surface of the second conductive layer 614. Subsequently, high-concentration n⁺ type impurities are implanted to those portions of the p⁻ type semiconductor layers 623, 623 that are formed above the top surface of the insulation layer 622a. As a result, n⁺ type diffusion layers 624, 624 are formed on the p⁻ type semiconductor layers 623, 623 above the top surface of the insulation layer 622a, as source regions (drain regions) of the selection transistors SST (SDT). That is, the n⁺ type diffusion layers 624, 624 become the n⁺ type semiconductor layers 426, 426 after the following process.

Figure 11C:
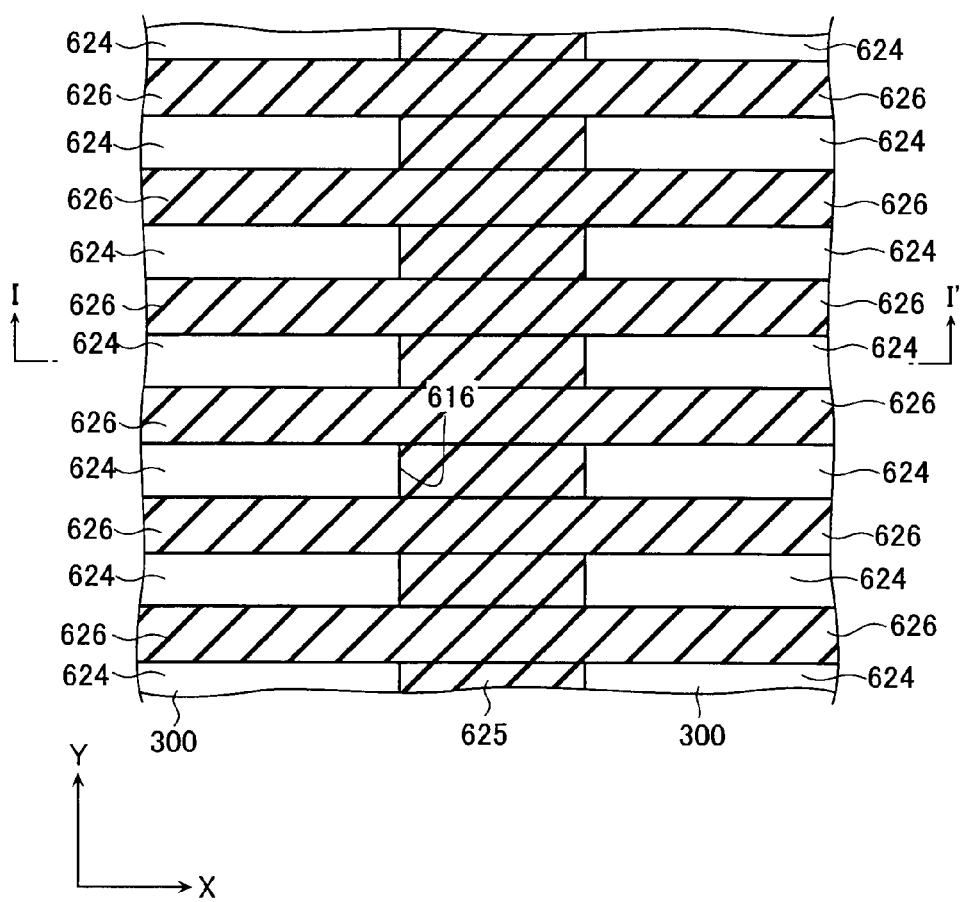
FIG. 11C is a top plan view illustrating a manufacturing process of the non-volatile semiconductor storage device according to the first embodiment of the present invention.
Figure 11D:
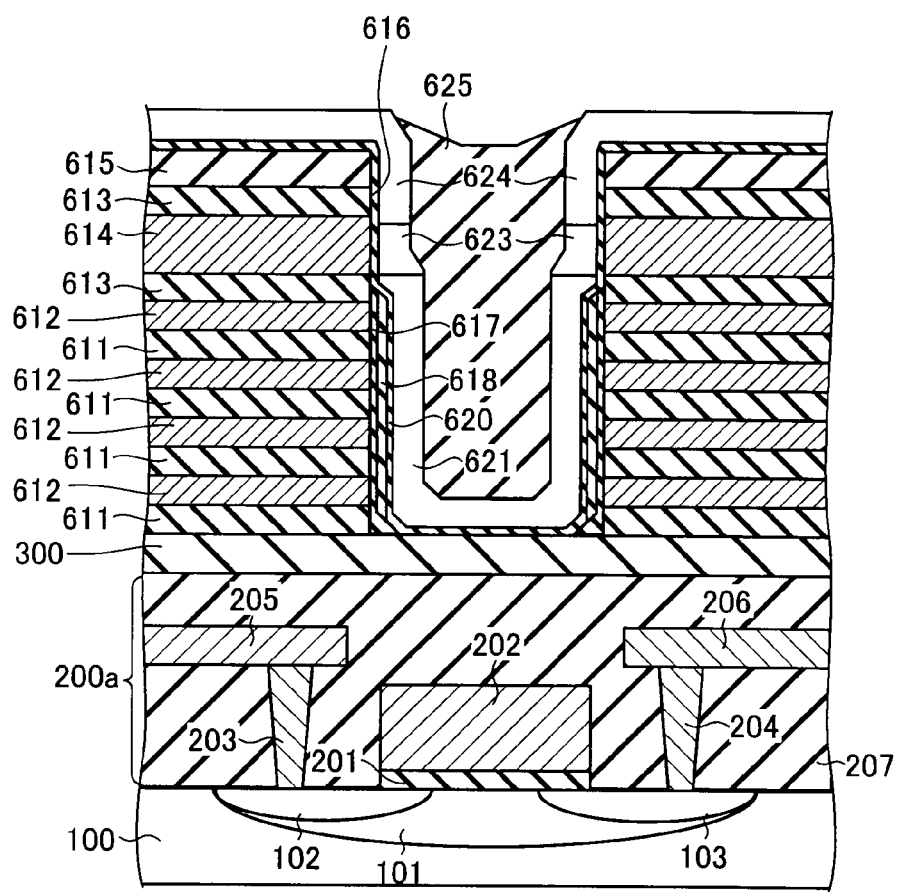
FIG. 11D is a cross-sectional view, taken along line I-I' of FIG. 11C, illustrating a manufacturing process of the non-volatile semiconductor storage device according to the first embodiment of the present invention.

Subsequently, as illustrated in FIGS. 11C and 11D, an insulation layer 625 is further formed on the side surfaces of the n⁺ type semiconductor layers 624, 624. Then, the n⁻ type semiconductor layer 621, the p⁻ type semiconductor layer 623, and the n⁺ type diffusion layer 624 are etched in a stripe form by a predetermined pitch in the y direction in order to electrically separate these layers into multiple units. At this moment, the first conductive layers 612, the second conductive layer 614, and the interlayer insulation layers 611, 613, 615 are not etched and each layer remains in a layered form in the y direction. Thereafter, insulation layers 626 are laminated over the apertures formed by etching.

Figure 12A:
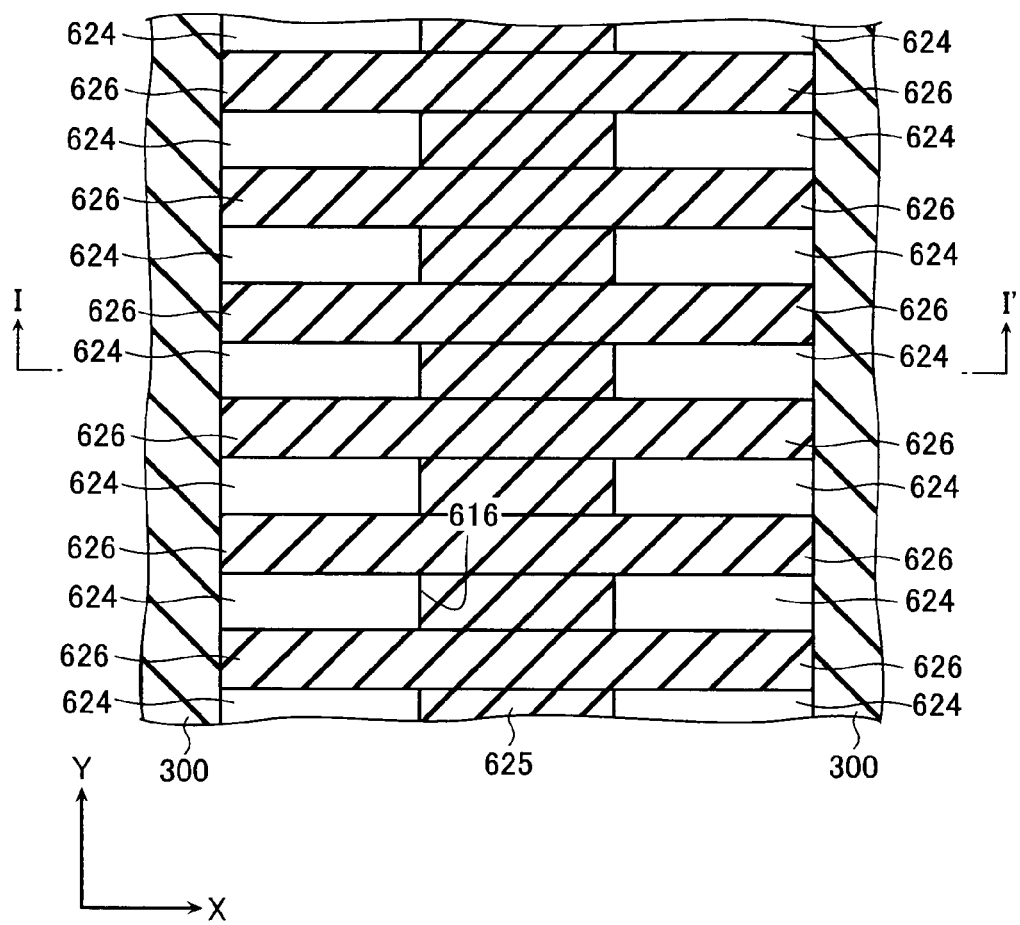
FIG. 12A is a top plan view illustrating a manufacturing process of the non-volatile semiconductor storage device according to the first embodiment of the present invention.
Figure 12B:
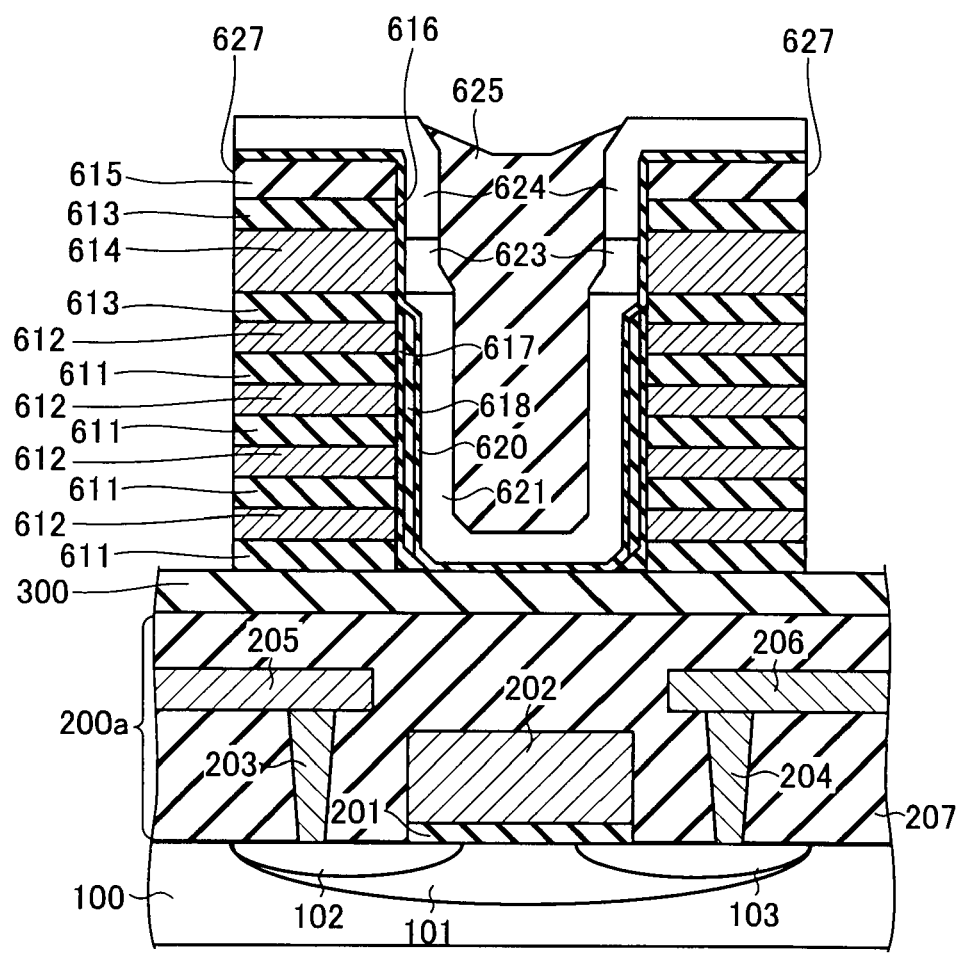
FIG. 12B is a cross-sectional view, taken along line I-I' of FIG. 12A, illustrating a manufacturing process of the non-volatile semiconductor storage device according to the first embodiment of the present invention.

Then, as illustrated in FIGS. 12A and 12B, to electrically separate the first conductive layers 612 in a block adjacent in the x direction, apertures 627 are formed so as to expose the respective edges in the x direction, opposed to the silicon oxide film 617, of the first conductive layers 612, the second conductive layer 614, and the interlayer insulation layers 611, 613, 615. Note that the support layer 300 will not be etched since it is composed of such material that has a higher selectivity for etching than that of the memory cell array layer 400a (labeled 611 to 615), as mentioned above.

Figure 13A:
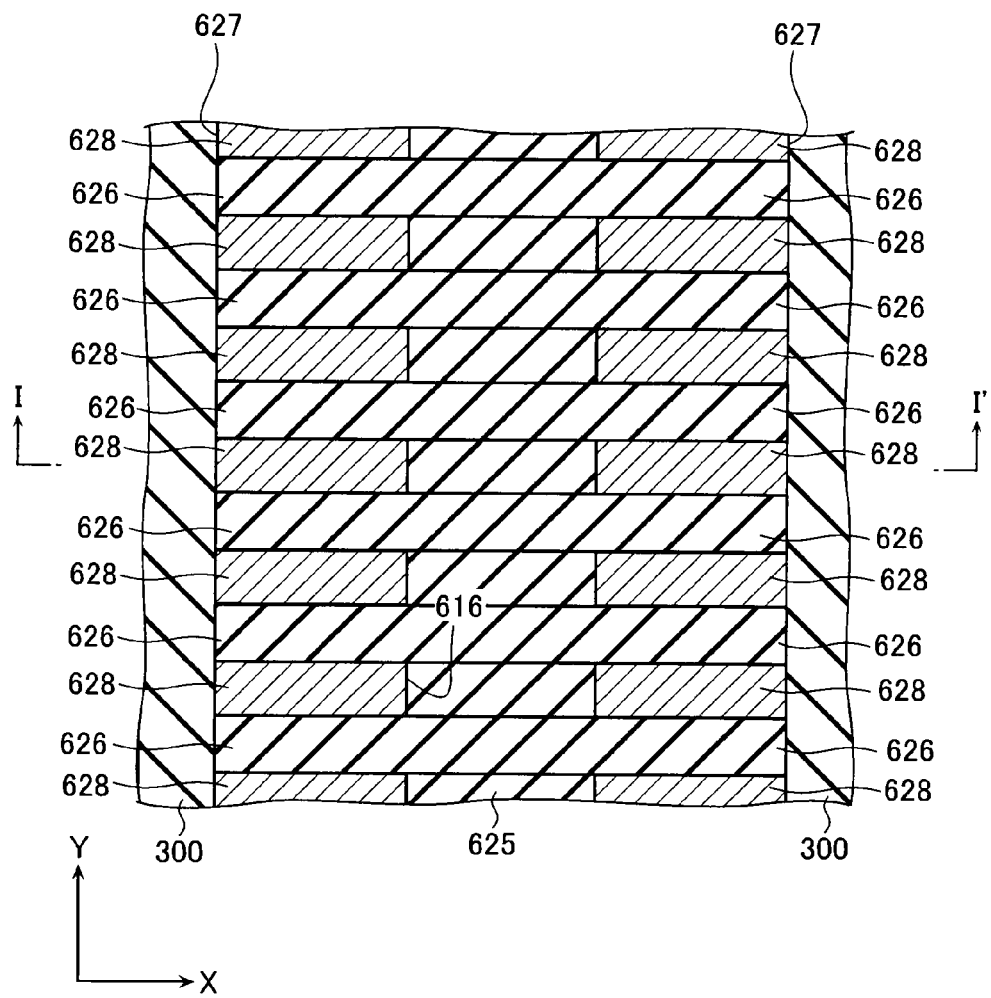
FIG. 13A is a top plan view illustrating a manufacturing process of the non-volatile semiconductor storage device according to the first embodiment of the present invention.
Figure 13B:
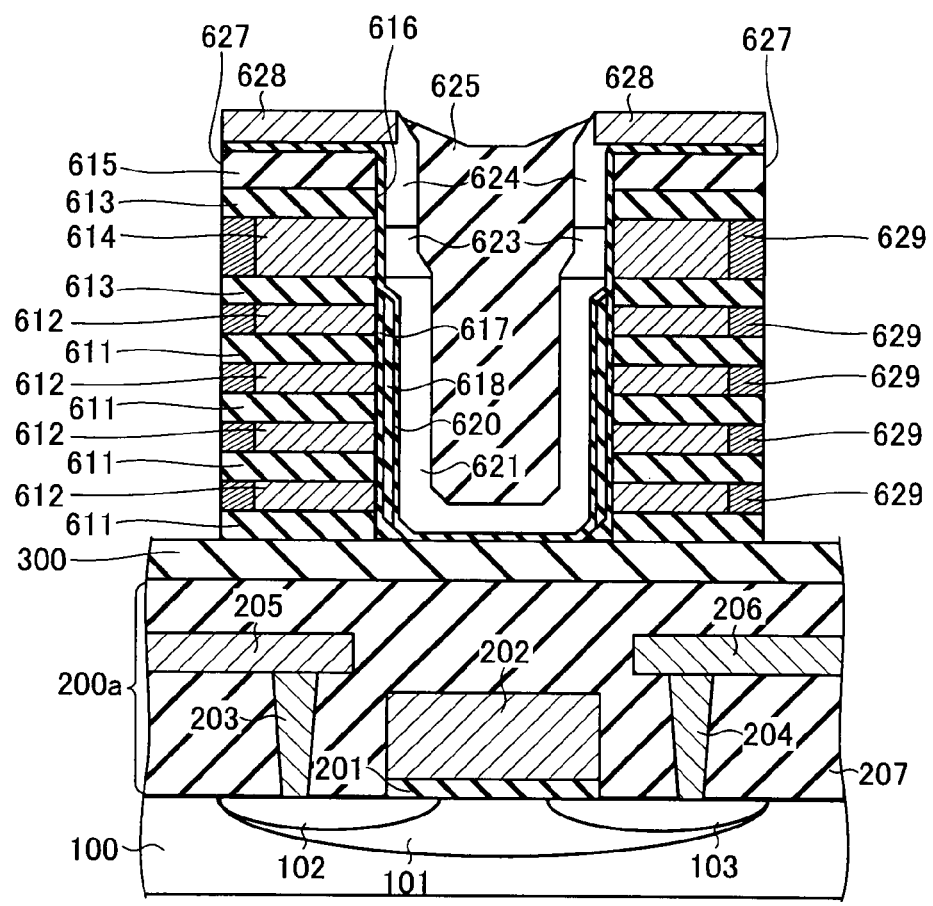
FIG. 13B is a cross-sectional view, taken along line I-I' of FIG. 13A, illustrating a manufacturing process of the non-volatile semiconductor storage device according to the first embodiment of the present invention.

Then, as illustrated in FIGS. 13A and 13B, the upper portions of the exposed n⁺ type diffusion layers 624, 624 and the edges in the x direction of the exposed first conductive layers 612 and second conductive layer 614 are silicidized. As a result, silicide layers 628, 628 are formed on the upper portions of the n⁺ type diffusion layers 624, 624. That is, the silicide layers 628, 628 become the contact layers 431, 431 after the following process. In addition, through this silicidation, silicide layers 629 are formed on the edges in the x direction of the first conductive layers 612 and the second conductive layer 614.

Figure 14B:
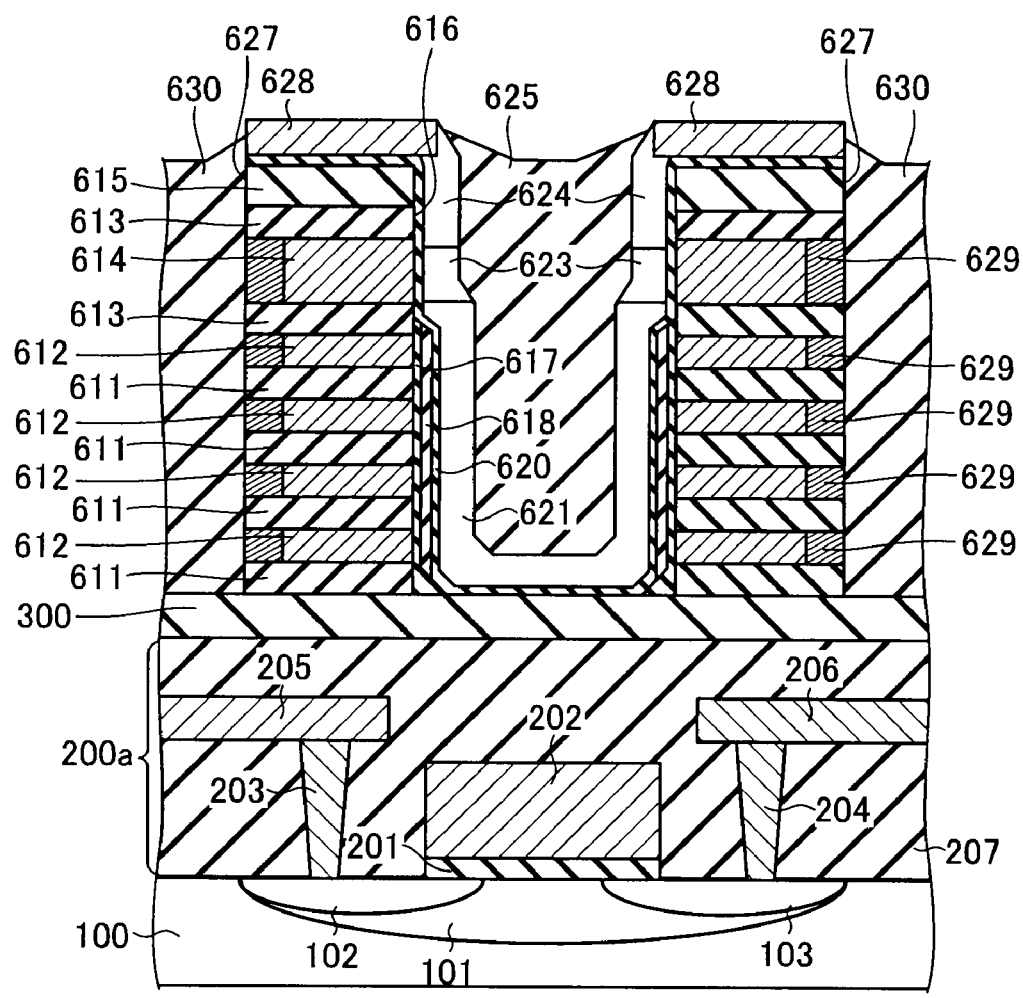
FIG. 14B is a cross-sectional view, taken along line I-I' of FIG. 14A, illustrating a manufacturing process of the non-volatile semiconductor storage device according to the first embodiment of the present invention.

Then, as illustrated in FIGS. 14A and 14B, insulation layers 630 are deposited over the apertures 627. Then, the third lamination parts 430A and 430B are formed and the resulting state is depicted in FIGS. 3 and 4.

(Advantages of Non-Volatile Semiconductor Storage Device According to First Embodiment)

Advantages of the non-volatile semiconductor storage device according to the first embodiment will now be described below. The non-volatile semiconductor storage device according to the first embodiment allows a reduction in area of the NAND-type flash memory since it has laminated vertical memory cells MC and selection transistors. Additionally, the non-volatile semiconductor storage device of this embodiment achieves a further reduction in the occupation area since it has the control circuit layer 200a including the row decoder 21, the sense amplifier 22, etc., formed below the memory cell array layer 400a.

Further, the non-volatile semiconductor storage device of this embodiment has selection transistors and memory cell transistors formed on the side surfaces of laminated conductive layers and insulation layers. Thus, the selection transistors and the memory cell transistors involve small variations in roughness in the manufacturing process.

That is, the non-volatile semiconductor storage device of this embodiment achieves the reduced occupation area and variations in the transistor properties.

[Second Embodiment]
(Specific Configuration of Non-Volatile Semiconductor Storage Device According to Second Embodiment)

Figure 15:
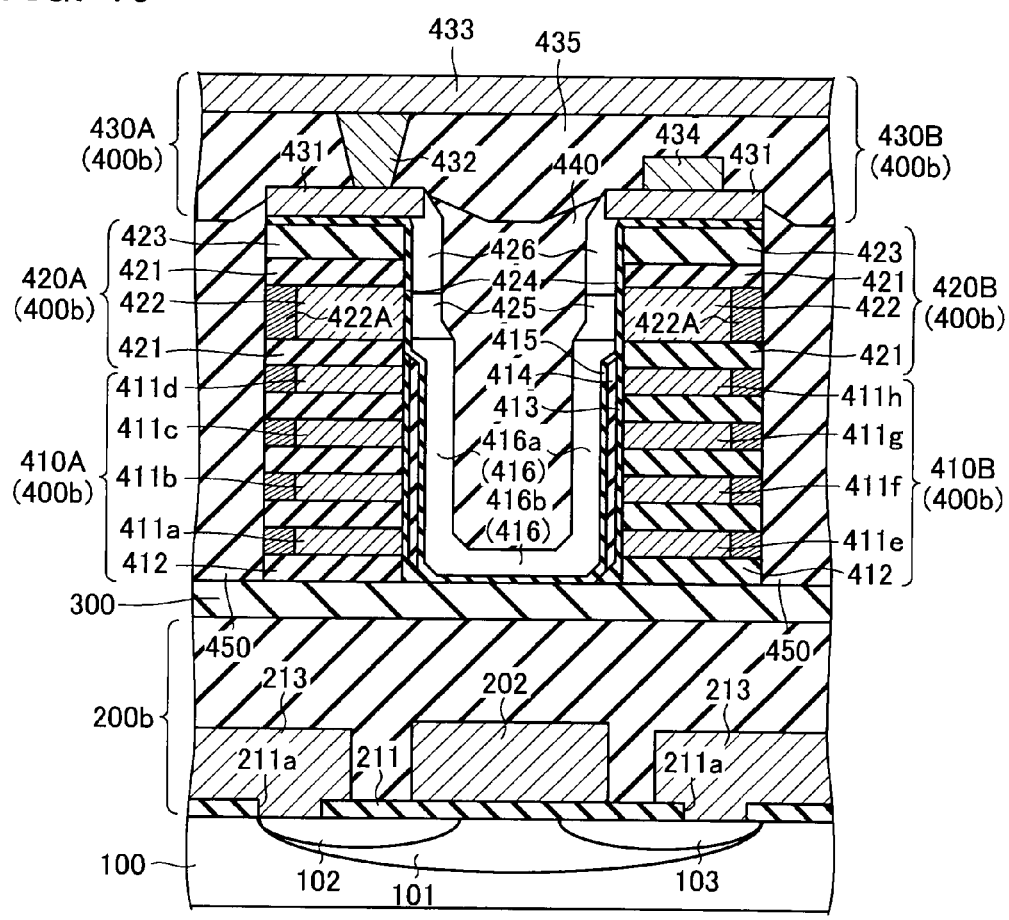
FIG. 15 is a cross-sectional view of a non-volatile semiconductor storage device according to a second embodiment of the present invention.

Referring now to FIG. 15, a specific configuration of a non-volatile semiconductor storage device according to a second embodiment of the present invention will be described below. As illustrated in FIG. 15, the non-volatile semiconductor storage device according to the second embodiment has a control circuit layer 200b different than the first embodiment. Note that the same referent numerals represent the same components as the first embodiment and description thereof will be omitted in the second embodiment.

As illustrated in FIG. 15, the control circuit layer 200b has insulation layers 211 that are provided on the top surface of the substrate 100, gate conductive layers 202 that are provided on the top surfaces of the insulation layers 211, and wiring layers 213 that are provided on the top surfaces of the insulation layers 211.

Each of the insulation layers 211 has apertures 211a, 211a on source and drain regions 102, 103. The wiring layers 213, 213 are electrically connected to the source and drain regions 102 and 103 via the apertures 211a, 211a. The wiring layers 213 are composed of, e.g., tungsten silicide.

(Advantages of Non-Volatile Semiconductor Storage Device According to Second Embodiment)

The non-volatile semiconductor storage device according to the second embodiment has the same advantages as the first embodiment.

Also, in the non-volatile semiconductor storage device according to the second embodiment, compared to metal wiring layers, the wiring layers 213 are resistant to treatment with heat since they are composed of tungsten silicide.

[Third Embodiment]
(Specific Configuration of Non-Volatile Semiconductor Storage Device According to Third Embodiment)

Figure 16:
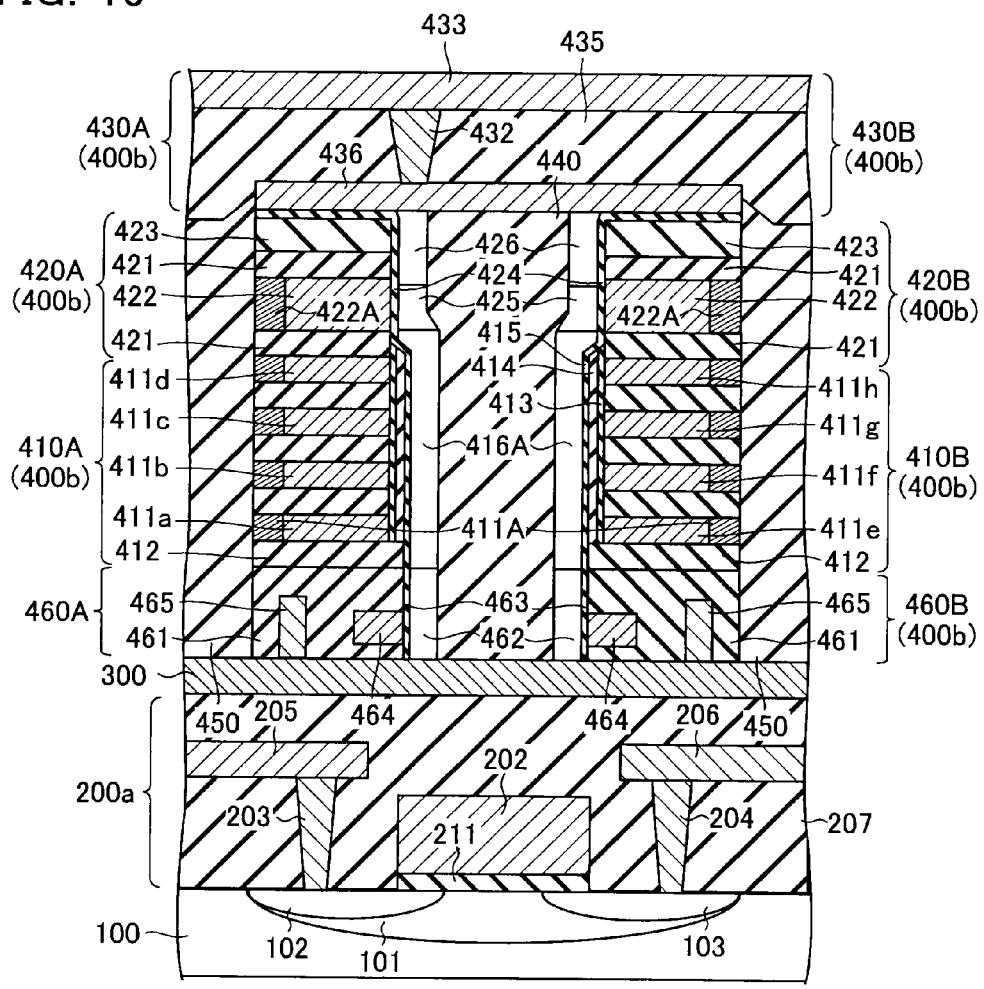
FIG. 16 is a cross-sectional view of a non-volatile semiconductor storage device according to a third embodiment of the present invention.

Referring now to FIG. 16, a specific configuration of a non-volatile semiconductor storage device according to a third embodiment of the present invention will be described below. As illustrated in FIG. 16, the non-volatile semiconductor storage device according to the third embodiment has a memory array layer 400b different than the first embodiment. Note that the same reference numerals represent the same components as the first embodiment and description thereof will be omitted in the third embodiment.

As illustrated in FIG. 16, the non-volatile semiconductor storage device according to the third embodiment is different than the first embodiment in the configurations of the support layer 300, the first lamination parts 410A and 410B, and the third lamination parts 430A and 430B. In addition, fourth lamination parts 460A and 460B are formed between the first lamination parts 410A and 410B and the support layer 300.

The support layer 300 is composed of a conductive layer. For example, the support layer 300 is composed of Aluminum (Al), copper (Cu), platinum (Pt), gold (Au), silver (Ag), tungsten (W), nickel (Ni), cobalt (Co), titanium (Ti), tantalum (Ta), monocrystalline silicon, multicrystalline silicon, or silicide layer (metal).

Each of the first lamination parts 410A and 410B has an $n^-$ type semiconductor layer 416A with a configuration where the bottom part 416b of the $n^-$ type semiconductor layer 416 is omitted, instead of the U-shaped $n^-$ type semiconductor layer 416 in the first embodiment. That is, the $n^-$ type semiconductor layers 416A has an I-shaped cross-section in the direction of I-I'.

Each of the third lamination parts 430A and 430B has a contact layer 436 common to the third lamination parts 430A and 430B, instead of the contact layers 431, 431. The contact layer 436 is connected to the $n^+$ type semiconductor layers 426, 426 in the second lamination parts 420A and 420B.

Each of the fourth lamination parts 460A and 460B has an interlayer insulation layer 461 that is formed below the first interlayer insulation layer 412 (bottom layer), an $n^-$ type semiconductor layer 462 that is formed in contact with the bottom parts of the $n^-$ type semiconductor layers 416A and extends to the lamination direction, and a gate insulation layer 463 that is formed between the $n^-$ type semiconductor layer 462 and the interlayer insulation layer 461.

In addition, each of the fourth lamination parts 460A and 460B has a gate conductive layer 464 that is formed adjacent to the gate insulation layer 463 and a wiring layer 465 that is connected to the $n^-$ type semiconductor layer 462 via the support layer 300. The wiring layers 465 function as the source lines SL. Thus, the fourth lamination parts 460A and 460B have functions as source-side selection transistors SST.

That is, unlike the first and second embodiments, the third embodiment has a configuration where source-side selection transistors SGS are arranged below the memory cell array layer 400a.

(Advantages of Non-Volatile Semiconductor Storage Device According to Third Embodiment)

The non-volatile semiconductor storage device according to the third embodiment has the same advantages as the first embodiment.

While embodiments of the non-volatile semiconductor storage device have been described, the present invention is not intended to be limited to the disclosed embodiments and various other changes, additions, replacements or the like may be made thereto without departing from the spirit of the invention.

What is claimed is:

1. A non-volatile semiconductor storage device comprising:
   a substrate;
   a control circuit layer provided on the substrate;
   a support layer provided entirely above the control circuit layer; and
   a memory cell array layer provided on the support layer, the memory cell array layer comprising:
      a first semiconductor layer substantially formed in a first direction perpendicular to the substrate;
      memory cell transistors formed on the first semiconductor layer,
      a selection transistor formed on the first semiconductor layer;
   the control circuit layer comprising at least one of a row decoder driving word lines and provided below the memory cell array layer, or a sense amplifier sensing and amplifying a signal from bit lines and provided below the memory cell array layer.

2. The non-volatile semiconductor storage device according to claim 1, wherein
   the selection transistor is formed in a position higher than the memory cell transistors in the first direction.

3. The non-volatile semiconductor storage device according to claim 1, wherein
   the first semiconductor layer is formed in a U-shape as viewed from a second direction perpendicular to the first direction.

4. The non-volatile semiconductor storage device according to claim 1, wherein
   the first semiconductor layer is formed in an I-shape as viewed from a second direction perpendicular to the first direction.

5. The non-volatile semiconductor storage device according to claim 1, wherein
   the selection transistor includes a source and a drain formed in the first semiconductor layer.

6. The non-volatile semiconductor storage device according to claim 1, further comprising:
   a first insulation layer formed on a first side of the first semiconductor layer, the first side being opposite of the memory cell transistors.

7. The non-volatile semiconductor storage device according to claim 1, wherein the control circuit layer further comprises a transistor having its source and a drain formed on the substrate.

8. The non-volatile semiconductor storage device according to claim 7, wherein the control circuit layer further comprises a contact plug layer connected to the source and drain formed on the substrate; and
   a first wiring layer connected to the top surface of the contact plug layer.

9. The non-volatile semiconductor storage device according to claim 7, wherein the control circuit layer further comprises:
   a second insulation layer provided on the substrate and including apertures on the upper portions of the source and drain; and
   a second wiring layer connected to the source and drain through the apertures of the second insulation layer.

10. The non-volatile semiconductor storage device according to claim 1, wherein
    the support layer is composed of a material that has a higher selectivity for etching than the memory cell array layer.

11. The non-volatile semiconductor storage device according to claim 10, wherein the support layer is composed of alumina oxide.

* * * * *